United States Patent
Mallela et al.

(10) Patent No.: US 11,024,709 B2
(45) Date of Patent: Jun. 1, 2021

(54) VERTICAL FIN FIELD EFFECT TRANSISTOR WITH AIR GAP SPACERS

(71) Applicant: INTERNATIONAL BUSINESS MACHINES CORPORATION, Armonk, NY (US)

(72) Inventors: Hari V. Mallela, Poughquag, NY (US); Robert R. Robison, Rexford, NY (US); Reinaldo A. Vega, Mahopac, NY (US); Rajasekhar Venigalla, Hopewell Junction, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/810,398

(22) Filed: Mar. 5, 2020

(65) Prior Publication Data
US 2020/0212174 A1    Jul. 2, 2020

Related U.S. Application Data

(62) Division of application No. 16/141,156, filed on Sep. 25, 2018, now Pat. No. 10,644,104, which is a
(Continued)

(51) Int. Cl.
*H01L 29/78*  (2006.01)
*H01L 29/06*  (2006.01)
(Continued)

(52) U.S. Cl.
CPC .... *H01L 29/0649* (2013.01); *H01L 21/31111* (2013.01); *H01L 21/764* (2013.01); *H01L 27/1211* (2013.01); *H01L 29/0653* (2013.01); *H01L 29/0657* (2013.01); *H01L 29/1033* (2013.01); *H01L 29/41741* (2013.01); *H01L 29/456* (2013.01); *H01L 29/6653* (2013.01);
(Continued)

(58) Field of Classification Search
CPC ..... H01L 21/823437; H01L 21/823487; H01L 21/28141; H01L 21/2815
See application file for complete search history.

(56) References Cited

U.S. PATENT DOCUMENTS

| 5,869,374 | A | 2/1999 | Wu |
| 6,093,612 | A | 7/2000 | Suh |

(Continued)

FOREIGN PATENT DOCUMENTS

| CN | 103681331 | 3/2014 |
| JP | 2009021269 | 1/2009 |

(Continued)

OTHER PUBLICATIONS

List of IBM Patents or Patent Applications Treated as Related dated Mar. 5, 2020, 2 pages.

*Primary Examiner* — George R Fourson, III
(74) *Attorney, Agent, or Firm* — Tutunjian & Bitetto, P.C.; Randall Bluestone

(57) ABSTRACT

A fin field effect transistor device with air gaps, including a source/drain layer on a substrate, one or more vertical fin(s) in contact with source/drain layer, a gate metal fill that forms a portion of a gate structure on each of the one or more vertical fin(s), and a bottom void space between the source/drain layer and the gate metal fill.

20 Claims, 23 Drawing Sheets

Related U.S. Application Data division of application No. 15/626,433, filed on Jun. 19, 2017, now Pat. No. 10,243,041, which is a division of application No. 15/243,174, filed on Aug. 22, 2016, now Pat. No. 9,911,804.

(51) Int. Cl.

| | | |
|---|---|---|
| *H01L 21/764* | (2006.01) | |
| *H01L 27/12* | (2006.01) | |
| *H01L 29/417* | (2006.01) | |
| *H01L 29/45* | (2006.01) | |
| *H01L 29/66* | (2006.01) | |
| *H01L 21/311* | (2006.01) | |
| *H01L 29/786* | (2006.01) | |
| *H01L 29/10* | (2006.01) | |
| *H01L 21/8234* | (2006.01) | |
| *H01L 21/28* | (2006.01) | |

(52) U.S. Cl.
CPC .. *H01L 29/66545* (2013.01); *H01L 29/66666* (2013.01); *H01L 29/66742* (2013.01); *H01L 29/66795* (2013.01); *H01L 29/785* (2013.01); *H01L 29/78642* (2013.01); *H01L 21/2815* (2013.01); *H01L 21/28141* (2013.01); *H01L 21/823437* (2013.01); *H01L 21/823487* (2013.01)

(56) References Cited

U.S. PATENT DOCUMENTS

| | | | |
|---|---|---|---|
| 7,510,916 | B2 | 3/2009 | Chu |
| 7,683,441 | B2 | 3/2010 | Shin |
| 7,741,663 | B2 | 6/2010 | Hause et al. |
| 8,216,909 | B2 | 7/2012 | Abadeer et al. |
| 8,742,478 | B2 | 6/2014 | Chung et al. |
| 9,735,246 | B1 * | 8/2017 | Basker ................ C23C 16/401 |
| 10,395,988 | B1 * | 8/2019 | Cheng ............... H01L 29/66545 |
| 10,453,934 | B1 * | 10/2019 | Basker ............. H01L 21/28088 |
| 2010/0052029 | A1 * | 3/2010 | Huang ............... H01L 29/7827 257/309 |
| 2017/0294537 | A1 * | 10/2017 | Cheng ............... H01L 29/66742 |
| 2017/0330951 | A1 * | 11/2017 | Basker ................ C23C 14/081 |
| 2017/0330965 | A1 * | 11/2017 | Basker ............... H01L 21/3081 |
| 2019/0172927 | A1 * | 6/2019 | Jagannathan ....... H01L 29/6653 |
| 2020/0006329 | A1 * | 1/2020 | Lilak ...................... H01L 24/32 |

FOREIGN PATENT DOCUMENTS

| | | |
|---|---|---|
| JP | 2010157588 | 7/2010 |
| KR | 1020000007795 | 2/2000 |
| KR | 100669804 | 1/2007 |
| TW | 388923 | 5/2000 |
| TW | 432716 | 5/2001 |

\* cited by examiner

VERTICAL FIN FIELD EFFECT TRANSISTOR WITH AIR GAP SPACERS

BACKGROUND

Technical Field

The present invention generally relates to formation of air gaps between field effect transistor (FET) gates and source/drain regions, and more particularly to the fabrication and removal of sacrificial spacers to form air channels in the FET structure.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a fin field effect transistor (finFET) device with air gaps is provided. The arrangement of the fin field effect transistor device includes a source/drain layer on a substrate. The arrangement further includes one or more vertical fin(s) in contact with source/drain layer. The arrangement further includes a gate metal fill that forms a portion of a gate structure on each of the one or more vertical fin(s), and a bottom void space between the source/drain layer and the gate metal fill.

In accordance with another embodiment of the present invention, a method is provided for forming a fin field effect transistor device with air gaps. The method includes the step of forming one or more vertical fins on a substrate. The method further includes the step of forming a source/drain layer on the substrate in contact with the one or more vertical fins on a substrate. The method further includes the step of forming a sacrificial bottom spacer on the source/drain layer. The method further includes the step of forming a sacrificial spacer cap on the sacrificial bottom spacer. The method further includes the step of removing the sacrificial bottom spacer to form a bottom void space between the source/drain layer and the sacrificial spacer cap.

In accordance with yet another embodiment of the present invention, a fin field effect transistor device with air gaps is provided. The arrangement of the fin field effect transistor device includes a source/drain layer on a substrate. The arrangement further includes a vertical fin in contact with source/drain layer. The arrangement further includes a gate structure that covers a portion of the vertical fin. The arrangement further includes a top source/drain on the vertical fin, and an upper void space between the top source/drain and the gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
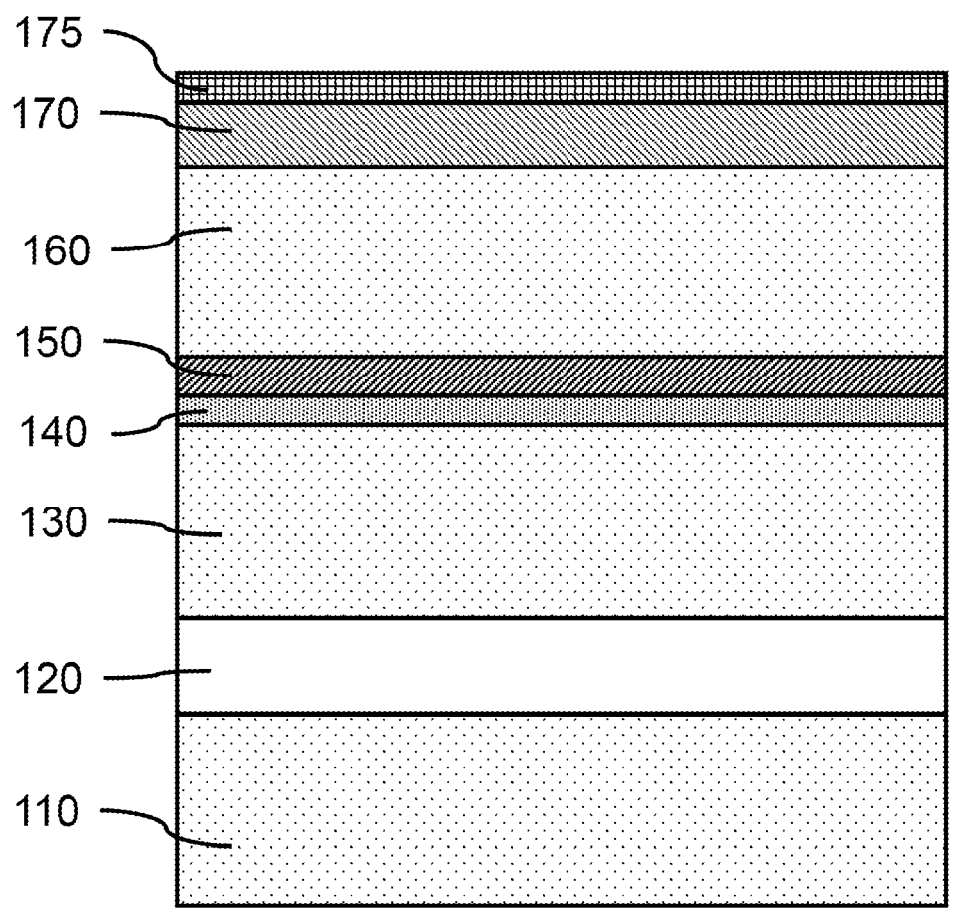
FIG. 1 is a cross-sectional side view of a sidewall image transfer layer stack on a semiconductor-on-insulator substrate, in accordance with an embodiment of the present invention.

Principles and embodiments of the present invention relate generally to formation of sacrificial spacers within a fin field effect transistor (finFET) device structure that can be subsequently removed to form air gaps between the source/drains and gate structure. The air gaps can provide reduced parasitic outer fringe capacitance and/or a higher breakdown voltage between a gate and adjacent source/drain regions. Power consumption also can be reduced by reducing leakage currents.

Principles and embodiments of the present invention also relate generally to forming a sacrificial bottom spacer below a gate structure and a sacrificial top spacer above the gate structure, where the sacrificial top spacer and sacrificial bottom spacer can be at least partially laterally etched to form a void space adjacent to the gate structure. The sacrificial bottom spacer and sacrificial top spacer can be removed after overlying layers and/or components have been formed that would prevent subsequent layers from filling in the air gap if the sacrificial bottom spacer or sacrificial top spacer had been removed.

Principles and embodiments of the present invention also relate generally to forming a merged top source/drain to cap an upper void space and/or a bi-layer bottom source/drain in forming a bottom void space. A bottom void space can be further increased in size utilizing a crystallographically selective etch of the bottom source/drain.

Exemplary applications/uses to which the present principles can be applied include, but are not limited to: formation of complementary metal oxide silicon (CMOS) field effect transistors (FETs) formed by coupled finFETs, digital gate devices (e.g., NAND, NOR, XOR, etc.), and memory devices (e.g., SRAM, DRAM, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a sidewall image transfer layer stack on a semiconductor-on-insulator substrate is shown in accordance with an embodiment of the present invention.

In one or more embodiments, a substrate 110 can be a semiconductor or an insulator with an active surface semiconductor layer. The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. In one or more embodiments, the substrate 110 can be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer. The surface/active layer can be on a buried oxide (BOX) layer that can physically separate and electrically insulate the active layer from a mechanically supporting portion of the substrate 110.

In one or more embodiments, a buried oxide layer 120 can be formed on at least a portion of a substrate 110. An active semiconductor layer (ASL) 130 can be on the BOX layer 120. A fin template liner 140 can be formed on at least a portion of the active semiconductor layer 130, and a fin template layer 150 can be formed on the fin template liner 140, where the fin template layer and fin template liner can be hardmask layers. A mandrel layer 160 can be formed on the fin template layer 150, and a mandrel template layer 170 can be formed on the mandrel layer 160, where the mandrel template layer 170 can be a hardmask layer.

In one or more embodiments, one or more vertical fin(s) can be formed on the BOX layer 120 by a sidewall image transfer process, where an arrangement of sidewall spacers formed on one or more sacrificial mandrels can be transferred to an active semiconductor layer 130.

In various embodiments, a fin template layer 150 can be a hard mask layer for masking the substrate during transfer of a vertical fin pattern to the active semiconductor layer 130. The fin template layer 150 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a titanium nitride (TiN) or combinations thereof, where the fin template layer 150 may include one or more layers. The fin template layer 120 can also act as an etch-stop layer for forming sacrificial mandrels from a mandrel layer 160.

In one or more embodiments, a fin template liner 140 can be formed between the active semiconductor layer 130 and the fin template layer 150, where the fin template liner 140 can protect the active semiconductor layer 130 from the introduction of defects during formation of the fin template layer 150. In various embodiments, the fin template liner 140 can be a silicon oxide (SiO), a silicon oxynitride (SiON), or a combination thereof.

In various embodiments, mandrel layer 160 can be a sacrificial material that can be easily and selectively patterned and etched. The mandrel layer 160 can be amorphous silicon (a-Si), poly-silicon (p-Si), amorphous carbon (a-C), silicon-germanium (SiGe), or suitable combinations thereof.

In one or more embodiments, a mandrel template layer 170 can be formed on the mandrel layer 160, where the mandrel template layer 170 can be a hard mask layer. The mandrel template layer 170 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a titanium nitride (TiN) or combinations thereof, where the mandrel template layer 170 may include one or more layers.

In one or more embodiments, a mandrel mask layer 175 can be formed on the mandrel template layer 170, where the mandrel mask layer 175 can be a lithographic resist material (e.g., a photo resist material, an e-beam resist material, etc.)

that can be patterned and developed to expose portions of the underlying mandrel template layer 170.

In one or more embodiments, the mandrel mask layer 175 can be a positive or negative resist material, for example, Poly (methyl methacrylate) (PMMA) or SU-8, or an electron-beam cured material, for example, hydrogen silsesquioxane (HSQ).

In various embodiments, a mandrel pattern can be formed in the mandrel mask layer 175 and transferred to the mandrel template layer 170 and mandrel layer 160 to form one or more sacrificial mandrels on the fin template layer 150.

In various embodiments, a plurality of vertical fins can be formed by a sidewall image transfer (SIT) process, where the SIT process can be a self-aligned double patterning (SADP), or self-aligned quadruple patterning (SAQP) that repeats SADP to provide quadruple features at a tighter pitch between vertical fins. In various embodiments, a direct print can be used to provide fins with a looser pitch.

Figure 2:
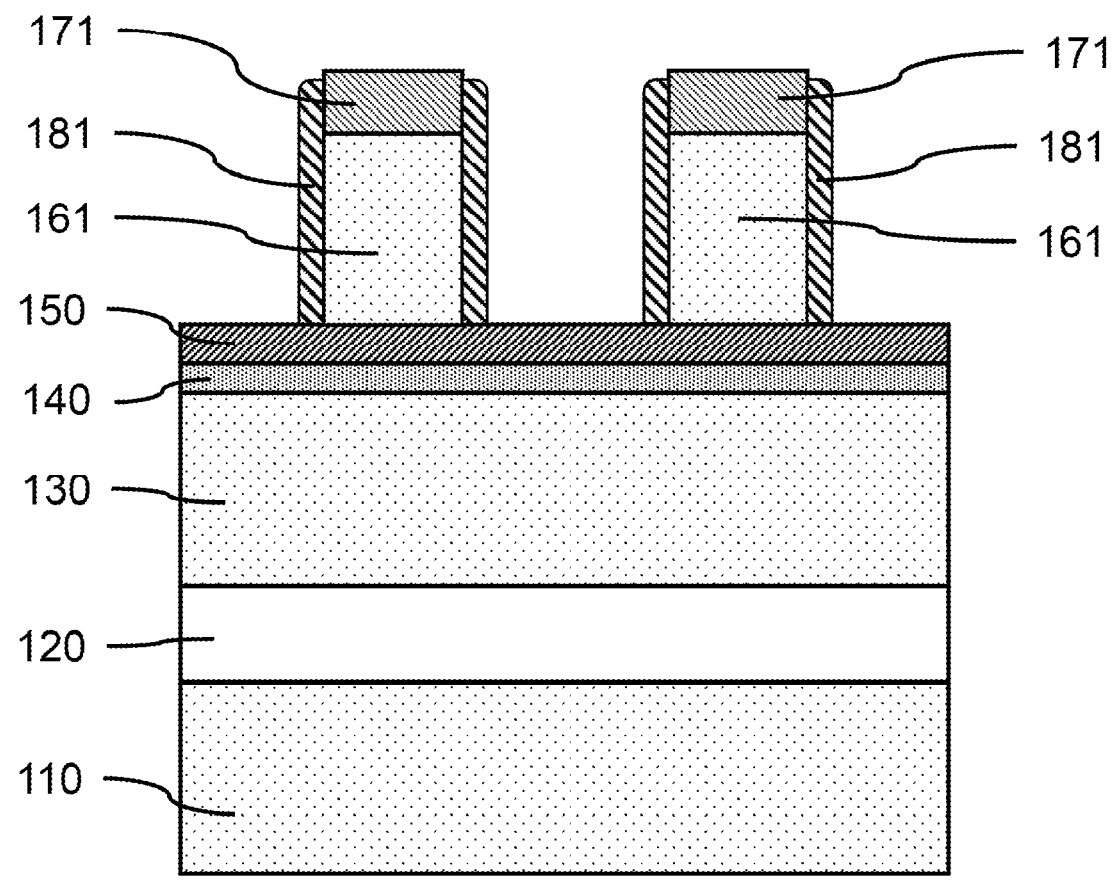
FIG. 2 is a cross-sectional side view of a plurality of sidewall spacers on the sidewalls of the sacrificial mandrels and on the fin template layer, in accordance with an embodiment of the present invention.

FIG. 2 is a cross-sectional side view of a plurality of sidewall spacers on the sidewalls of the sacrificial mandrels and on the fin template layer, in accordance with an embodiment of the present invention.

In one or more embodiments, one or more mandrel template(s) 171 can be formed on the mandrel layer 160, and one or more sacrificial mandrels 161 can be formed on the fin template layer 150. In various embodiments, the sacrificial mandrels 161 can be formed by removing portions of the mandrel layer 160 exposed between mandrel template(s) 171, where portions of the mandrel layer 160 can be removed, for example, by a directional dry plasma etching process (e.g., a reactive ion etch (RIE)).

In one or more embodiments, sidewall spacers 181 can be formed on the one or more sacrificial mandrels, where the sidewall spacers 181 can be formed by blanket depositing a selectively etchable material on the exposed fin template layer surface, sacrificial mandrel sidewalls, and top surface of the mandrel template(s) 171, and then etch back the blanket deposited materials to leave the sidewall spacers 181.

In various embodiments, the sidewall spacers 181 can be formed of silicon oxide (SiO), silicon nitride (SiN), silicon oxynitride (SiON), or combinations thereof, where the sidewall spacers 181 can be selectively etchable in relation to the mandrel template(s) 171, sacrificial mandrels 161, fin template layer 150, fin template liner 140, and active semiconductor layer 130.

Figure 3:
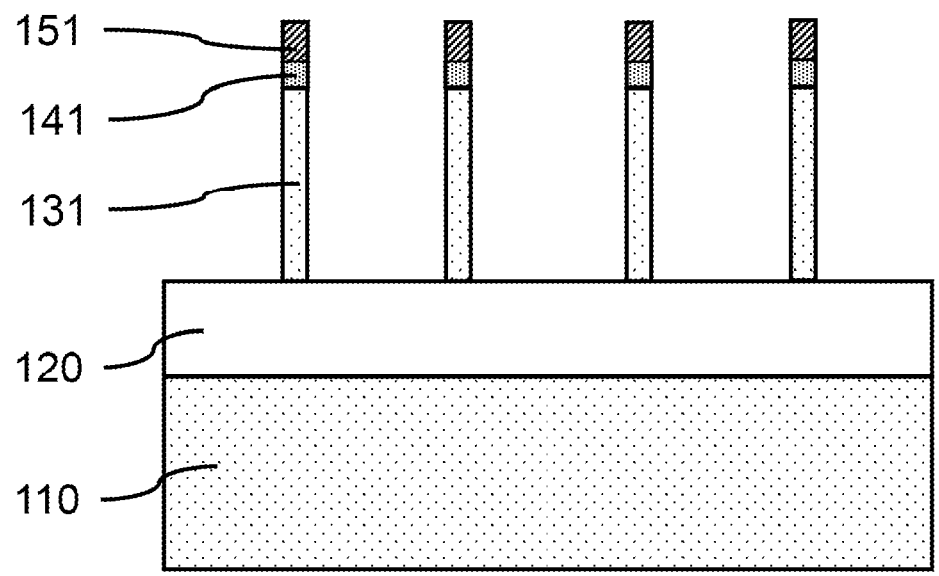
FIG. 3 is a cross-sectional side view of a fin template and template liner on each of a plurality of vertical fins formed on a BOX layer, in accordance with an embodiment of the present invention.

FIG. 3 is a cross-sectional side view of a fin template and template liner on each of a plurality of vertical fins formed on a BOX layer, in accordance with an embodiment of the present invention.

In one or more embodiments, the pattern of the sidewall spacers 181 can be transferred to the underlying fin template liner 140 and/or fin template layer 150 to form a template liner 141 and/or fin template 151 on each of a plurality of vertical fins 131. The template liner 141 and/or fin template 151 can have a width and length that can determine the lateral size (i.e., width and length) of a formed vertical fin 131.

In one or more embodiments, the active semiconductor layer (ASL) 130 can be removed from between the template liners 141 and/or fin templates 151 down to the BOX layer 120, such that the thickness of the active semiconductor layer 130 can define the height of the one or more vertical fin(s) being formed. In various embodiments, the active semiconductor layer 130 may not be removed all the way down to the BOX layer, so the etching depth can determine the height of the one or more vertical fin(s) being formed.

In one or more embodiments, the one or more vertical fin(s) 131 can be formed by a directional, dry plasma etch that removes a portion of the exposed active semiconductor layer 130 from between the template liner 141 and/or fin template 151, where the dry plasma etch can be an RIE.

Figure 4:
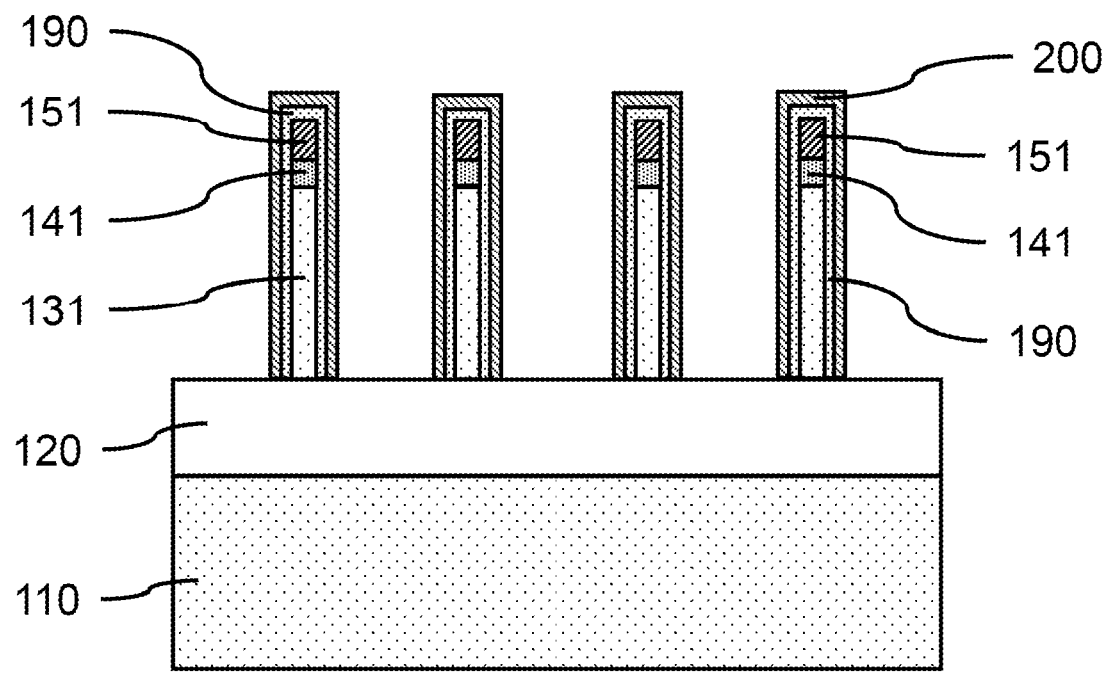
FIG. 4 is a cross-sectional side view of an inner protective cap and an outer protective cap on each vertical fin, in accordance with an embodiment of the present invention.

FIG. 4 is a cross-sectional side view of an inner protective cap and an outer protective cap on each vertical fin, in accordance with an embodiment of the present invention.

In one or more embodiments, a protective cap, that can include an inner protective cap 190 and an outer protective cap 200, can be formed on each vertical fin 131, template liner 141 and/or fin template 151. The protective cap can be formed by depositing an inner protective layer and an outer protective layer on the exposes surfaces of the vertical fin(s) 131, template liner 141 and/or fin template 151, and underlying active semiconductor layer 130 or BOX layer 120, depending on the depth of etch used to remove material from the active semiconductor layer (ASL) 130 to form the vertical fin(s) 131 (herein referred to as the BOX layer/ASL). At least a portion of an inner protective layer and/or the outer protective layer can be removed from the exposed surface of the active semiconductor layer 130 or the BOX layer 120 by a directional etch (e.g., RIE) to leave the inner protective cap(s) 190 and outer protective cap(s) 200 on the vertical fin(s) 131, template liner(s) 141 and/or fin template (s) 151.

In one or more embodiments, the inner protective liner 190 can be a different material from the outer protective liner 200, where the outer protective liner 200 can be selectively etchable versus the inner protective liner 190. In various embodiments, the inner protective liner 190 can be formed of silicon oxide (SiO), silicon nitride (SiN), or silicon oxynitride (SiON). In various embodiments, the outer protective liner 200 can be formed of silicon oxide (SiO), silicon nitride (SiN), or silicon oxynitride (SiON).

In one or more embodiments, the inner protective liner 190 can be conformally deposited on the exposed surfaces of the vertical fin(s) 131, template liner 141 and/or fin template 151, for example by ALD, PEALD, CVD, PECVD, or combinations thereof.

In one or more embodiments, the inner protective liner 190 can have a thickness in the range of about 1 nm to about 10 nm, or in the range of about 2 nm to about 4 nm. In various embodiments, the thickness of the conformally deposited inner protective liner 190 can be controlled by the deposition process parameters.

In one or more embodiments, the outer protective liner 200 can be conformally deposited on the exposed surfaces of the inner protective liner 190, for example by ALD, PEALD, CVD, PECVD, or combinations thereof.

In one or more embodiments, the outer protective liner 200 can have a thickness in the range of about 1 nm to about 10 nm, or in the range of about 2 nm to about 4 nm. In various embodiments, the thickness of the conformally deposited outer protective liner 200 can be controlled by the deposition process parameters.

Figure 5:
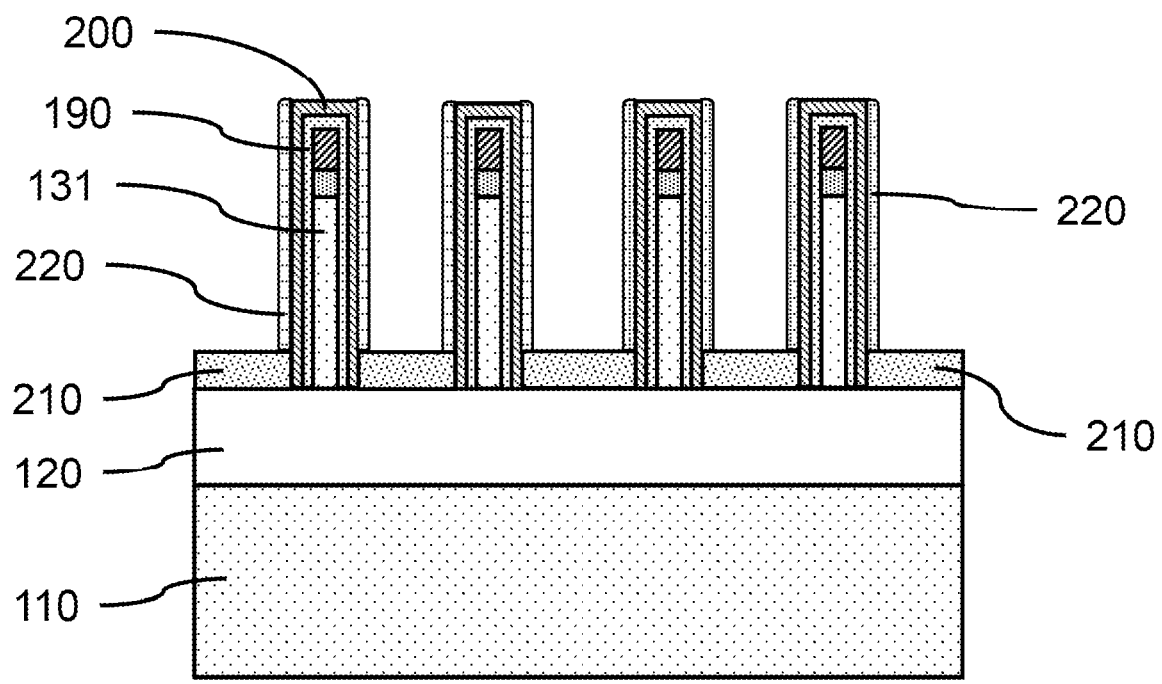
FIG. 5 is a cross-sectional side view of a provisional layer on the exposed lateral surfaces of the substrate, and dummy sidewalls on the outer protective cap, in accordance with an embodiment of the present invention.

FIG. 5 is a cross-sectional side view of a provisional layer on the exposed lateral surfaces of the substrate, and dummy sidewalls on the outer protective cap, in accordance with an embodiment of the present invention.

In one or more embodiments, a provisional layer 210 can be formed on at least a portion of the exposed lateral surfaces of the BOX layer/ASL and at least a portion of the outer protective cap 200, where the provisional layer 210 can be formed on the BOX layer/ASL by a directional deposition, for example, PVD or a gas cluster ion beam (GCIB) process. In one or more embodiments, the provisional layer 210 can be formed by CVD or PECVD, where the provisional layer 210 can be blanket deposited on the outer protective cap 200, and at least a portion of the exposed surfaces of the BOX layer 120. The blanket-deposited provisional layer 210 can extend above the top surfaces of the protective cap, wherein chemical-mechanical polishing (CMP) can be used to remove a portion of the provisional layer and provide a planarized surface. A selective etchback process, for example, by RIE, can be used to reduce the height of the provisional layer 210, where the provisional layer can then cover a lower portion of the outer protective cap 200. In various embodiments, the covered lower portion can be equal to or less than a third of the height of the vertical fin 131, or in the range of a quarter to a third of the height of the vertical fin 131.

In one or more embodiments, the provisional layer 210 can be amorphous silicon (a-Si) or polycrystalline silicon (p-Si), or a combination thereof, where the provisional layer 210 can be selectively removed from between the outer protective cap(s) 200.

In one or more embodiments, the provisional layer 210 can have a thickness in the range of about 5 nm to about 100 nm, or in the range of about 10 nm to about 50 nm, or in the range of about 20 nm to about 30 nm, where the thickness of the provisional layer 210 can define the thickness of a subsequently formed bottom source/drain layer.

In one or more embodiments, a dummy sidewall 220 can be formed on at least a portion of the outer protective cap 200 on each vertical fin 131, where the dummy sidewall can extend from the top of the outer protective cap to the surface of the provisional layer to cover a predetermined length of the outer protective cap 200 on the vertical fin(s) 131. The dummy sidewall 220 can protect at least a portion of the outer protective cap 200 during removal of the provisional layer.

In one or more embodiments, the dummy sidewall 220 can be a metal oxide, where the metal oxide can be a high-k metal oxide, for example, hafnium oxide (HfO), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), tantalum oxide (e.g., $TaO_2$, $Ta_2O_5$), titanium oxide (e.g., $TiO_2$), yttrium oxide (e.g., $Y_2O_3$), or aluminum oxide (e.g., $Al_2O_3$). The high-k metal oxide can further include dopants such as lanthanum and/or aluminum. The stoichiometry of the high-K compounds can vary.

In one or more embodiments, the dummy sidewall 220 can be formed by conformal deposition on the outer protective cap 200 and exposed surface of the provisional layer 210, and etching back the deposited material from the top surface of the outer protective cap 200 and exposed surface of the provisional layer 210. The dummy sidewalls 220 can remain on the sidewalls of the outer protective cap 200, where the dummy sidewalls can wrap around the vertical fins 131. In various embodiments, the dummy sidewalls can be conformally deposited by ALD, PEALD, CVD, PECVD, or combinations thereof.

Figure 6:
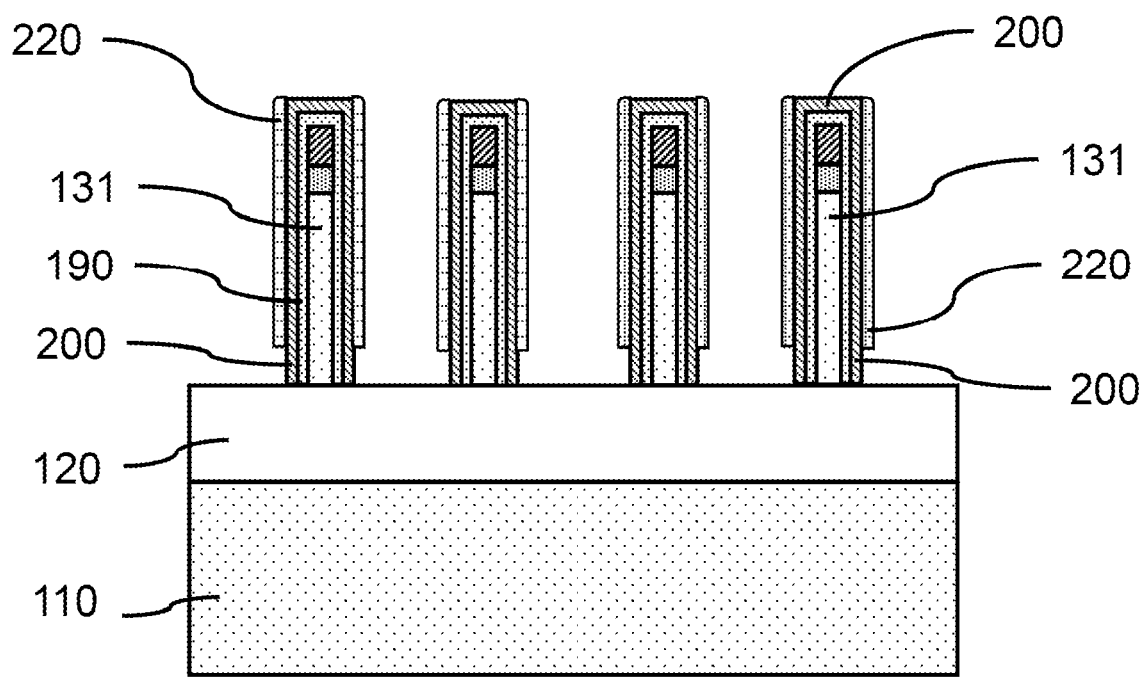
FIG. 6 is a cross-sectional side view of an exposed lower portion of the outer protective caps after removal of the provisional layer, in accordance with an embodiment of the present invention.

FIG. 6 is a cross-sectional side view of an exposed lower portion of the outer protective caps after removal of the provisional layer, in accordance with an embodiment of the present invention.

In one or more embodiments, the provisional layer 210 can be removed from the BOX layer/ASL to expose the BOX layer/ASL and at least a lower portion of the outer protective cap 200 along a height of vertical fin 131 between the surface of the BOX layer/ASL and a bottom edge of the dummy sidewall 220. The provisional layer 210 can be removed by an isotropic etch, for example a wet etch or a gaseous etch, where the isotropic etch can be selective to the material of the provisional layer.

Figure 7:
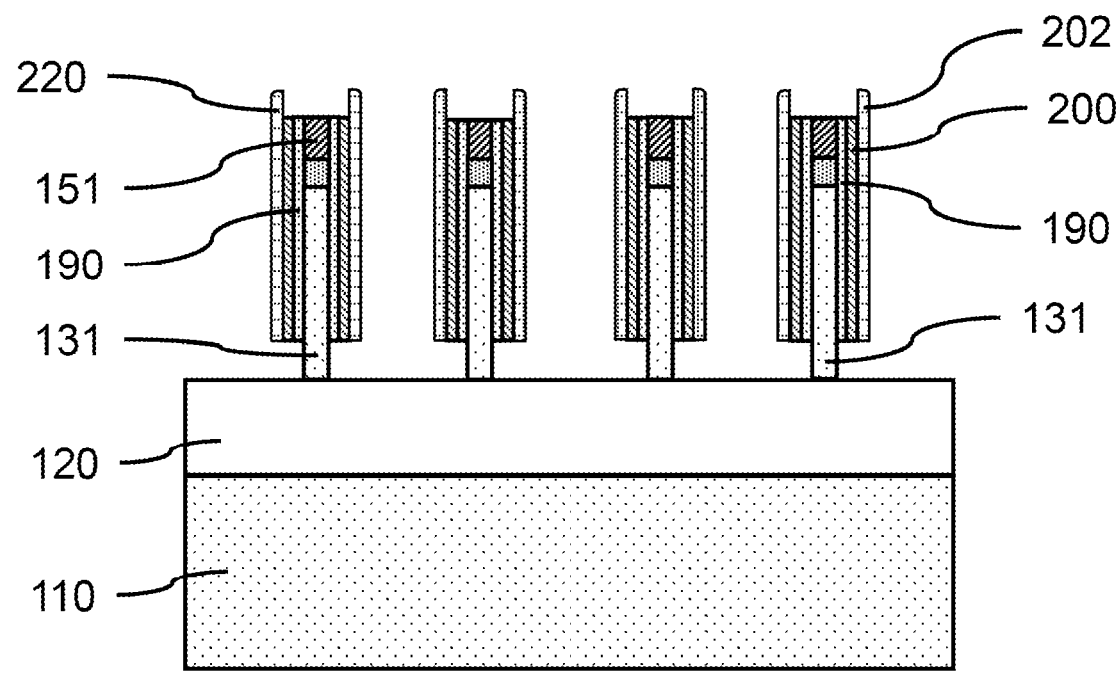
FIG. 7 is a cross-sectional side view of a top portion of the protective caps removed from fin templates between the dummy sidewalls, in accordance with an embodiment of the present invention.

FIG. 7 is a cross-sectional side view of a top portion of the protective caps removed from fin templates between the dummy sidewalls, in accordance with an embodiment of the present invention.

In one or more embodiments, the outer protective cap 200 and the inner protective cap 190 can be removed from the fin template 151 on the top of the vertical fin(s) 131, where the outer protective cap 200 and the inner protective cap 190 can be removed by a selective isotropic etch, while the dummy sidewalls 220 remain.

In one or more embodiments, the outer protective cap 200 and the inner protective cap 190 can be removed from the lower portion of the vertical fin(s) 131 exposed by the removal of the provisional layer 210. The lower portions of the outer protective cap 200 and the inner protective cap 190 can be removed by the same selective isotropic etching used to remove the outer protective cap 200 and the inner protective cap 190 on the top of the fin template 151. In various embodiments, the outer protective cap 200 can be removed by a first etch selective to the material of the outer protective cap, and the inner protective cap 190 can be removed by a second etch selective to the material of the inner protective cap.

In various embodiments, the portion of the outer protective cap 200 and the inner protective cap 190 on the sidewalls of the fin template 151, template liner 141, and vertical fin 131 remain where the outer protective cap 200 is covered by the dummy sidewall 220. A lower portion of the vertical fin(s) 131 can be exposed after removal of the lower portion of both the outer protective cap 200 and the inner protective cap 190, where the height of the vertical fin(s) 131 exposed can be determined by the thickness of the provisional layer 210, which can be predetermined based on the thickness of an intended bottom source/drain layer.

Figure 8:
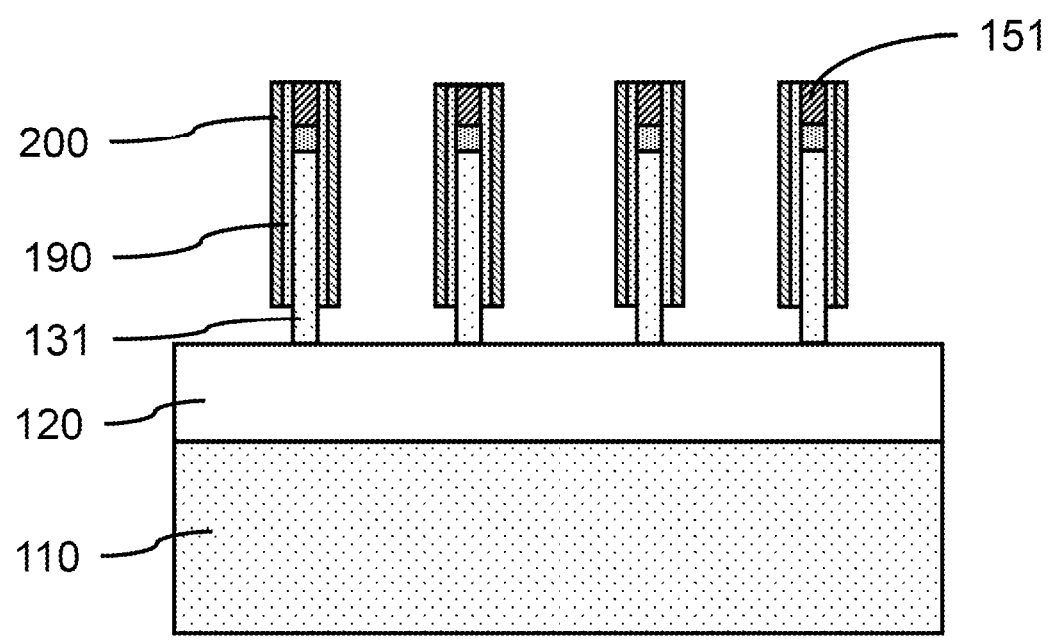
FIG. 8 is a cross-sectional side view of the outer protective cap and inner protective cap on the sidewalls of the fin template, template liner, and vertical fin, after removal of the dummy sidewalls, in accordance with an embodiment of the present invention.

FIG. 8 is a cross-sectional side view of the outer protective cap and inner protective cap on the sidewalls of the fin template, template liner, and vertical fin, after removal of the dummy sidewalls, in accordance with an embodiment of the present invention.

In one or more embodiments, the dummy sidewalls 220 can be removed from the outer protective liner 200, where the dummy sidewalls 220 can be selectively etched using an isotropic etch, for example, a wet etch. The outer protective liner 200 can be exposed after removal of the dummy sidewall 200.

In one or more embodiments, the width of an exposed lower portion of the vertical fin(s) 131 can be reduced, where the width can be reduced by a selective etching of the exposed vertical fin material. In various embodiments, the etch can be an isotropic plasma etch, or an isotropic wet etch. Removal of at least a portion of the exposed portion of the vertical fin(s) 131 proximal to the BOX layer/ASL can provide for formation of a source/drain region that is partially embedded into the fin, which can require less subsequent diffusion of dopants from the source/drain regions into the vertical fin to form intended junctions.

Figure 9:
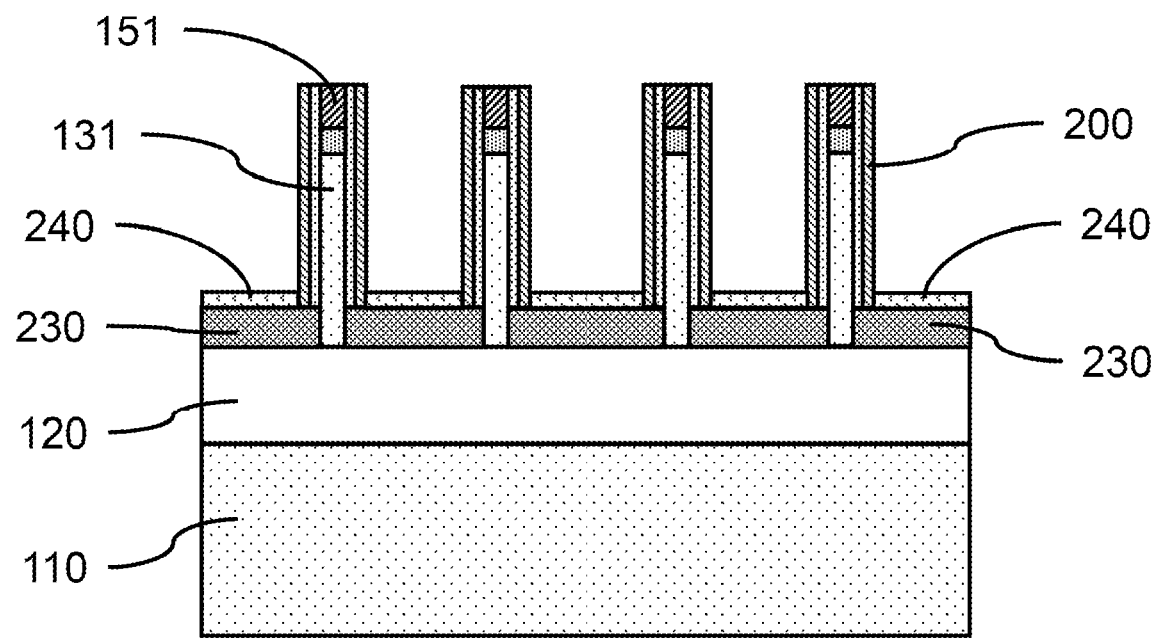
FIG. 9 is a cross-sectional side view of a source/drain layer formed on the exposed portion of the vertical fins and BOX layer, in accordance with an embodiment of the present invention.

FIG. 9 is a cross-sectional side view of a source/drain layer formed on the exposed portion of the vertical fins and BOX layer, in accordance with an embodiment of the present invention.

In one or more embodiments, a source/drain layer 230 can be formed on the BOX layer/ASL, where the source/drain layer 230 can form a bottom source/drain for the device and provide dopant(s) to at least a lower portion of the vertical fin(s) 131 adjacent to the source/drain layer 230. In various embodiments, the doped lower portion of one or more vertical fin(s) 131 and the source/drain layer 230 can form a bottom source/drain. The source/drain layer 230 can be in contact with one or more vertical fin(s), where the source/drain layer can electrically couple at least two adjacent vertical fins together to form a multi-fin finFET device.

In various embodiments, the source/drain layer 230 can be formed by epitaxial growth from the exposed surfaces of a crystalline vertical fin 131, where the source/drain layer 230 can grow laterally from the exposed crystalline surface over the underlying BOX layer/ASL. In various embodiments, the BOX layer 120 may not influence the epitaxial growth of the source/drain layer 230, where the BOX layer 120 is amorphous. In various embodiments, an underlying ASL can provide a crystalline surface that also promotes the epitaxial growth of the source/drain layer 230.

In various embodiments, the source/drain layer 230 may be the same material as the vertical fin(s) 131. The source/drain layer 230 can be doped in-situ to have a predetermined concentration of dopant, where a portion of the dopant can subsequently migrate into at least a lower portion of the vertical fin(s) 131 during a heat treatment. In various embodiments, the source/drain layer 230 can be epitaxially grown, and the height of the source/drain layer 230 can be subsequently reduced by a directional etch (e.g., RIE) to achieve an intended height.

In one or more embodiments, a sacrificial bottom spacer 240 can be formed on the source/drain layer 230, where the sacrificial bottom spacer 240 can be epitaxially grown on the source/drain layer 230. The sacrificial bottom spacer 240 can be a material different from the source/drain layer 230. In various embodiments, the sacrificial bottom spacer 240 can be silicon-germanium ($Si_xGe_{1-x}$), where the $Si_xGe_{1-x}$ can have a high Ge concentration (e.g., >50%) to allow selective etching in relation to a silicon or low-Ge concentration $Si_xGe_{1-x}$ source/drain layer 230. In various embodiments, the sacrificial bottom spacer 240 can be silicon-germanium ($Si_xGe_{1-x}$), silicon oxide (SiO), silicon oxycarbide (SiOC), silicon oxycarbonitride (SiOCN), amorphous carbon (a-C), or suitable combinations thereof, that can be selectively etched in relation to the source/drain layer 230.

Figure 10:
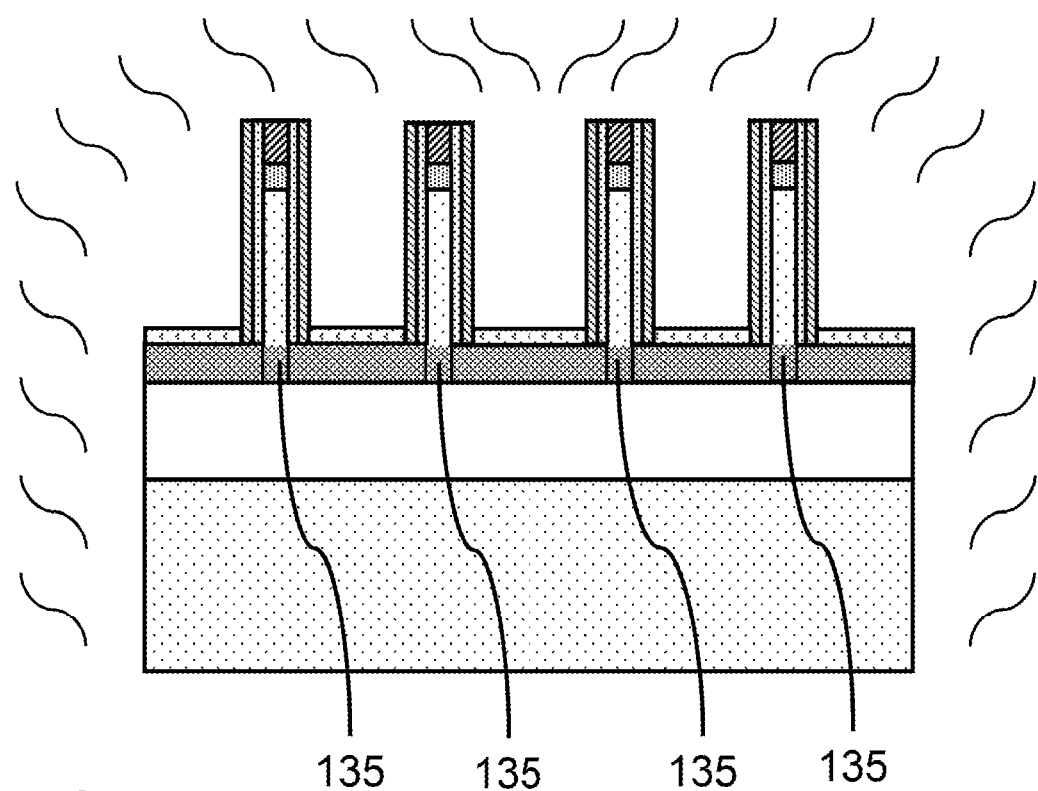
FIG. 10 is a cross-sectional side view of dopant diffusion into a lower portion of the vertical fins utilizing a heat treatment, in accordance with an embodiment of the present invention.

FIG. 10 is a cross-sectional side view of dopant diffusion into a lower portion of the vertical fins utilizing a heat treatment, in accordance with an embodiment of the present invention.

In one or more embodiments, the vertical fin(s) 131 and source/drain layer 230 can be heated to facilitate diffusion of dopant from the source/drain layer 230 into the adjacent vertical fin(s) 131, where the dopant can diffuse into a portion of the vertical fin in contact with the source/drain layer 230. In various embodiments, the source/drain layer 230 and vertical fin(s) 131 can be heat treated at a temperature in the range of about 700° C. to about 1300° C., or in the range of about 900° C. to about 1100° C., where the heat treatment can be a furnace anneal, a rapid thermal anneal, or a laser anneal. In various embodiments the anneal can be for a duration in the range of about 5 seconds to about 1 hour, where the duration of the heat treatment can depend on the temperature.

In various embodiments, the source/drain layer 230 can have a dopant concentration in the range of about $1\times10^{19}$ to about $1\times10^{21}$, or in the range of about $5\times10^{19}$ to about $5\times10^{20}$. The bottom diffusion region 135 in the lower portion of the vertical fin(s) 131 can have a dopant concentration in the range of about $1\times10^{18}$ to about $1\times10^{20}$, or in the range of about $5\times10^{18}$ to about $5\times10^{19}$, after the heat treatment.

Figure 11:
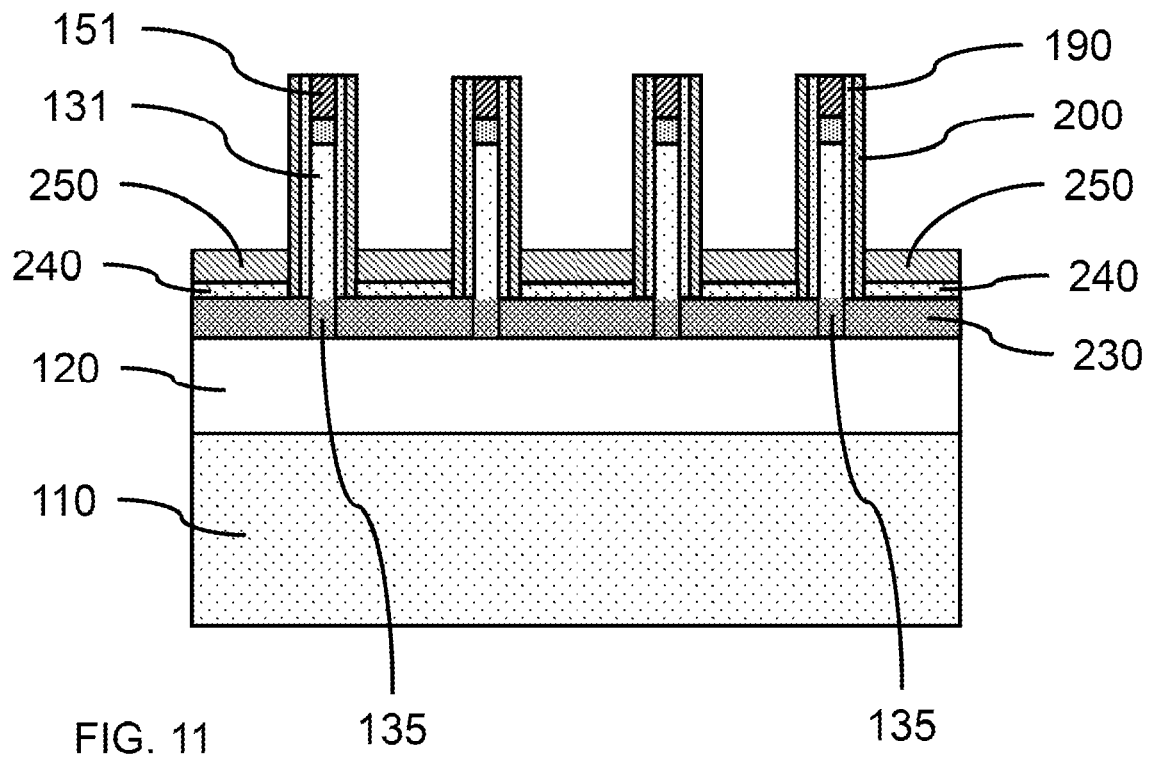
FIG. 11 is a cross-sectional side view of a bottom spacer cap on the sacrificial bottom spacer, in accordance with an embodiment of the present invention.

FIG. 11 is a cross-sectional side view of a bottom spacer cap on the sacrificial bottom spacer, in accordance with an embodiment of the present invention.

In one or more embodiments, spacer cap layer 250 can be formed on the sacrificial bottom spacer 240, where the spacer cap layer 250 can be the same material as the outer protective cap 200. In various embodiments, the thickness of the spacer cap layer 250 can be greater than the thickness of the outer protective cap 200.

Figure 12:
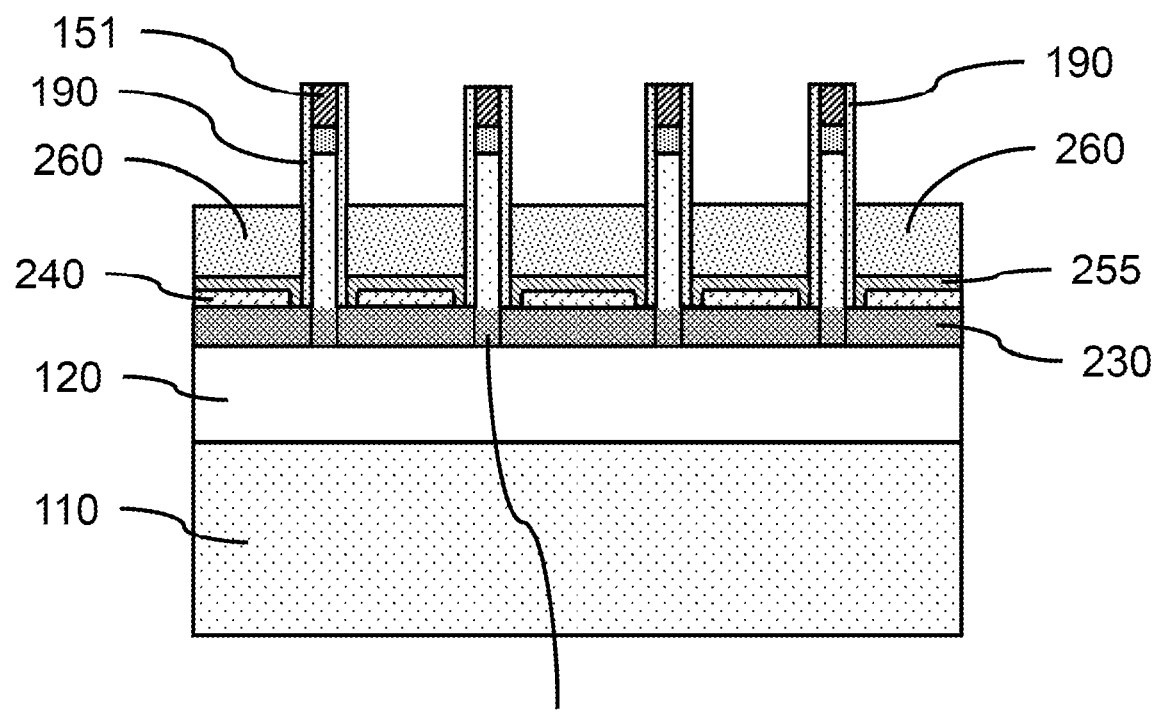
FIG. 12 is a cross-sectional side view of a sacrificial spacer cap on the sacrificial bottom spacer, and a dummy gate fill on the sacrificial spacer cap, in accordance with an embodiment of the present invention.

FIG. 12 is a cross-sectional side view of a sacrificial spacer cap on the sacrificial bottom spacer, and a dummy gate fill on the sacrificial spacer cap, in accordance with an embodiment of the present invention.

In one or more embodiments, the spacer cap layer 250 can be etched back to form a sacrificial spacer cap 255, where the etch-back can use an isotropic etch that also etches the outer protective cap 200. In various embodiments, the portion of the outer protective cap 200 exposed above the surface of the spacer cap layer 250 can be removed, and the thickness of the spacer cap layer 250 can be reduced to form the sacrificial spacer cap 255.

In one or more embodiments, a dummy gate fill 260 can be formed on the sacrificial spacer cap 255, where the dummy gate fill 260 can be amorphous silicon (a-Si). The thickness of the dummy gate fill 260 can define the length of a subsequently formed gate structure on the vertical fin 131, where the dummy gate fill may be aligned with a middle portion of the vertical fin.

In one or more embodiments, the dummy gate fill 260 can be blanket deposited on the exposed surface of the sacrificial spacer cap(s) 255 and inner protective cap 190 covering the vertical fin(s) 131 and fin template(s) 151. The blanket deposited dummy gate fill 260 can extend above the top surfaces of the fin template(s) 151, and a chemical mechanical polishing (CMP) can be used to remove excess material and reduce the height of the dummy gate fill 260 to the top surfaces of the fin template(s) 151. The CMP can provide a smooth, flat surface for subsequent processing. The height of the dummy gate fill 260 can be further reduced by a directional dry plasma etch, where the top surface of the dummy gate fill 260 can be reduced to a predetermined location on the vertical fin 131 to define the gate length on a device channel formed by the vertical fin 131.

In one or more embodiments, the thickness of the reduced height dummy gate fill 260 can be in the range of about 5 nm to about 40 nm, or in the range of about 10 nm to about 20 nm, although other thicknesses are contemplated.

Figure 13:
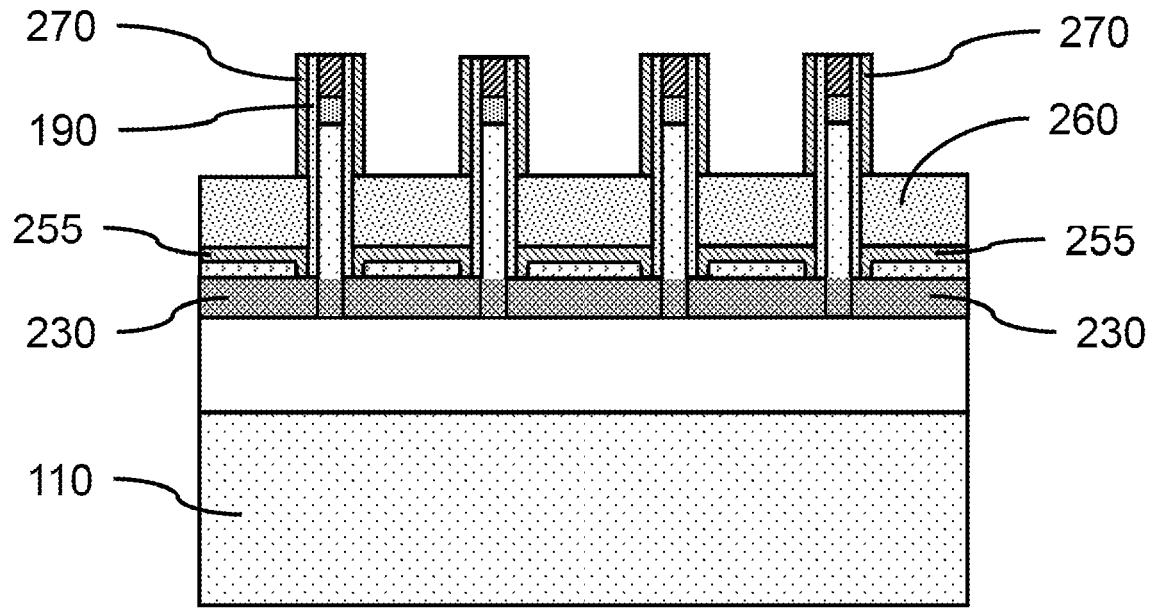
FIG. 13 is a cross-sectional side view of an upper spacer liner on an upper portion of the inner protective cap, in accordance with an embodiment of the present invention.

FIG. 13 is a cross-sectional side view of an upper spacer liner on an upper portion of the inner protective cap, in accordance with an embodiment of the present invention.

In one or more embodiments, an upper spacer liner 270 can be formed on an exposed portion of the inner protective cap 190 above the dummy gate fill 260. The upper spacer liner 270 can be conformally deposited on at least a portion of the exposed surface of the dummy gate fill 260, inner protective cap 190, and top surface of the fin template 151, where the upper spacer liner 270 can be conformally deposited by ALD, PEALD, CVD, PECVD, or combinations thereof.

In one or more embodiments, the upper spacer liner 270 can be silicon oxide (SiO), silicon nitride (SiN), silicon oxynitride (SiON), or combinations thereof, where the upper spacer liner 270 can be selectively etchable in relation to the dummy gate fill 260 and inner protective cap 190.

A portion of the upper spacer liner 270 on the lateral surfaces of the dummy gate fill 260 and fin templates 151 can be removed by an etch back process that leaves the upper spacer liner 270 on the vertical surfaces of the inner protective cap 190.

Figure 14:
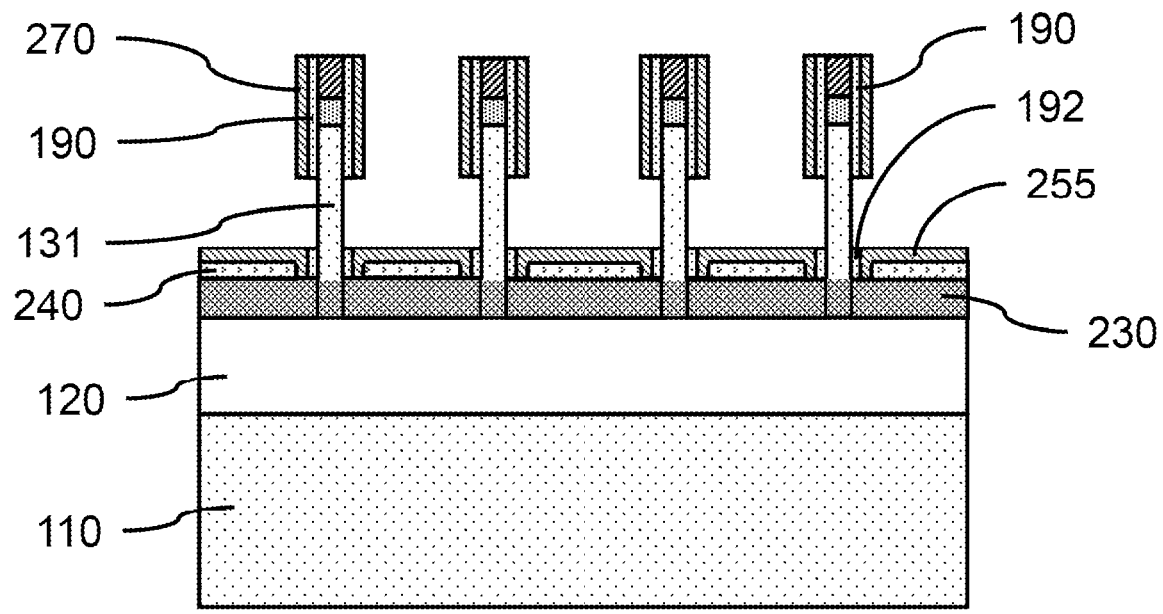
FIG. 14 is a cross-sectional side view of an upper spacer liner on an upper portion of the inner protective cap after removal of the dummy gate fill, in accordance with an embodiment of the present invention.

FIG. 14 is a cross-sectional side view of an upper spacer liner on an upper portion of the inner protective cap after removal of the dummy gate fill, in accordance with an embodiment of the present invention.

In one or more embodiments, the dummy gate fill 260 can be removed to expose the inner protective cap 190 between the upper spacer liner 270 and the top surface of the sacrificial spacer cap 255. The dummy gate fill 260 can be removed using an isotropic etch, for example, a wet etch, to ensure removal of dummy gate fill material below the overhanging upper spacer liner 270.

In one or more embodiments, the exposed portion of the inner protective cap 190 can be removed to expose the sidewalls of the vertical fin(s) 131. The exposed portion of the inner protective cap 190 can be removed using an isotropic etch selective for the material of the inner protective cap. After removal of the exposed portion, an upper portion of the inner protective cap 190 can remain on the fin template 151, template liner 141, and at least a portion of the vertical fin 131. An inner protective flange 192 can remain on the lower portion of the vertical fin 131 proximal to the bottom diffusion region 135 and source/drain layer 230.

Figure 15:
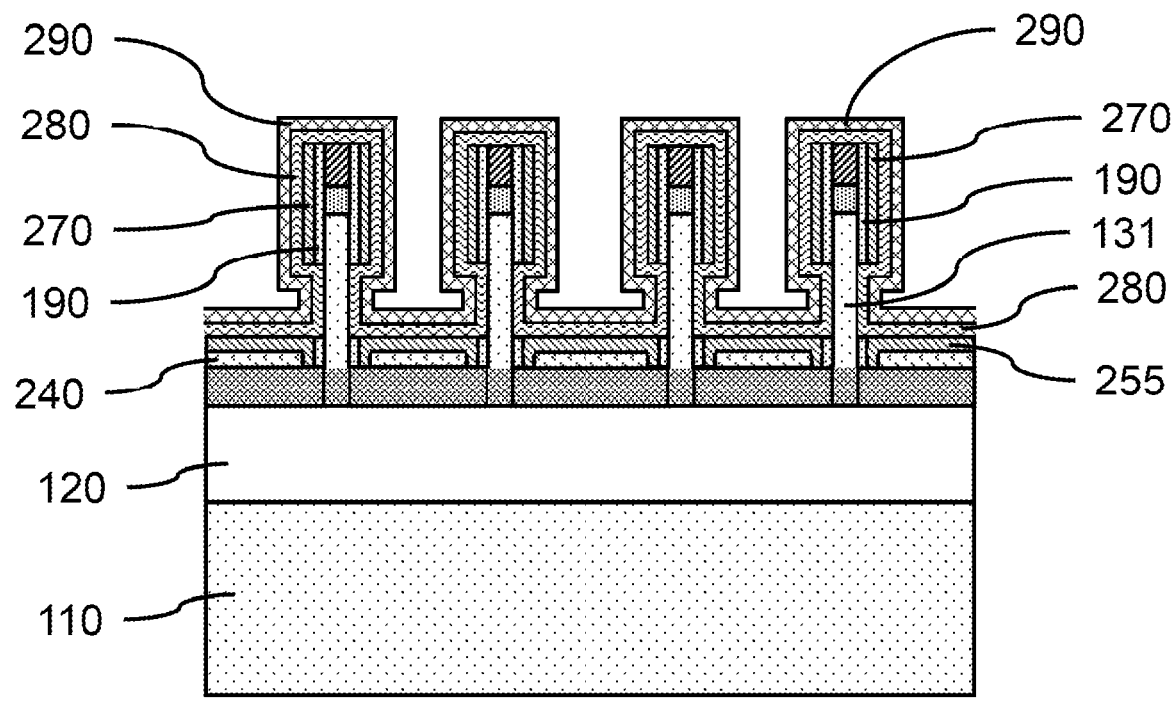
FIG. 15 is a cross-sectional side view of a protective cover layer and gate dielectric layer on the upper spacer liner and vertical fin, in accordance with an embodiment of the present invention.

FIG. 15 is a cross-sectional side view of a protective cover layer and gate dielectric layer on the upper spacer liner and vertical fin, in accordance with an embodiment of the present invention.

In one or more embodiments, a gate dielectric layer 280 can be formed on exposed portions of the sacrificial spacer cap(s) 255, vertical fin(s) 131, inner protective cap 190, and upper spacer liner 270, where the gate dielectric layer 280 can be formed by a conformal deposition. In various embodiments, the gate dielectric layer 280 can be formed by ALD, PEALD, CVD, PECVD, or combinations thereof.

In one or more embodiments, the gate dielectric layer 280 can be an insulating dielectric layer, for example, a silicon oxide (SiO), a high-K dielectric, or combinations thereof.

In various embodiments, an interfacial layer (IL) can be formed between at least a portion of the gate dielectric layer 280 and the vertical fin 131, where the IL is in contact with the walls of the vertical fin(s) 131, which can be a first interfacial layer, and a second layer in contact with the first layer can be the high-K dielectric, where the first interfacial layer can be silicon oxide (SiO) or an oxide of the vertical fin material. The oxide can be thermally or chemically formed on the vertical fin(s) 131. In various embodiments, the interfacial layer can be formed by reacting the exposed portion of the vertical fin(s) 131 with an oxidizing agent that can produce a thin (e.g., 1 to 5 monolayers) of oxide on the exposed portion of the vertical fin(s). The IL can reduce the amount of interface trapped charge, Da, at the channel-to-gate dielectric interface.

In various embodiments, the gate dielectric layer 280 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb $Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, a protective cover layer 290 can be formed on at least a portion of the gate dielectric layer 280, where the protective cover layer 290 can be conformally deposited by ALD, PEALD, CVD, PECVD, or combinations thereof.

In one or more embodiments, the protective cover layer 290 can be a metal nitride that can be selectively etchable in relation to the gate dielectric layer 280, for example, titanium nitride (TiN), tantalum nitride (TaN), zirconium nitride (ZrN), niobium nitride (NbN), tungsten nitride (WN), manganese nitride (MnN), or combinations thereof.

Figure 16:
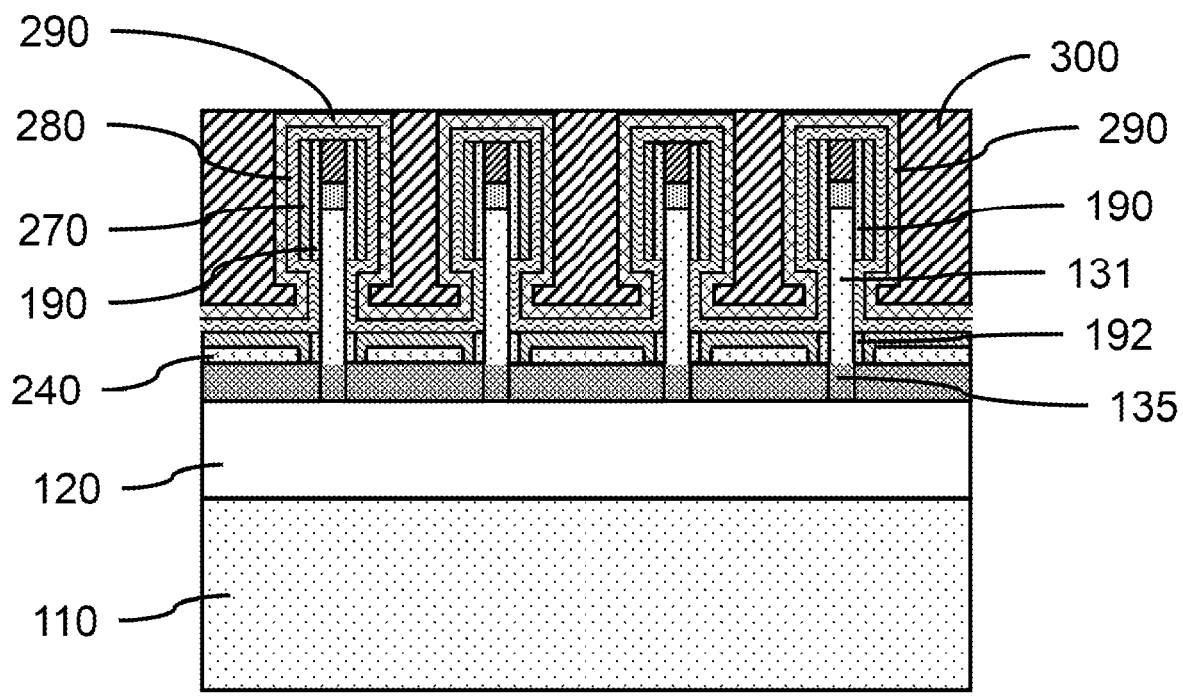
FIG. 16 is a cross-sectional side view of a temporary fill layer filling the spaces between the protective cover layer on the vertical fins, in accordance with an embodiment of the present invention.

FIG. 16 is a cross-sectional side view of a temporary fill layer filling the spaces between the protective cover layer on the vertical fins, in accordance with an embodiment of the present invention.

In one or more embodiments, a temporary fill layer 300 can be formed on the protective cover layer 290, where the temporary fill layer 300 can be blanket deposited on the protective cover layer 290, for example, by CVD, PECVD, or LPCVD. In various embodiments, the temporary fill layer 300 can be an organic resist material or a low-k oxide material, for example, PMMA, a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof. The protective cover layer 290 can be selectively etchable versus the temporary fill layer 300.

In various embodiments, the temporary fill layer 300 can extend above the top surface of the protective cover layer 290, and a CMP can be used to remove the excess material and provide a smooth, flat surface.

Figure 17:
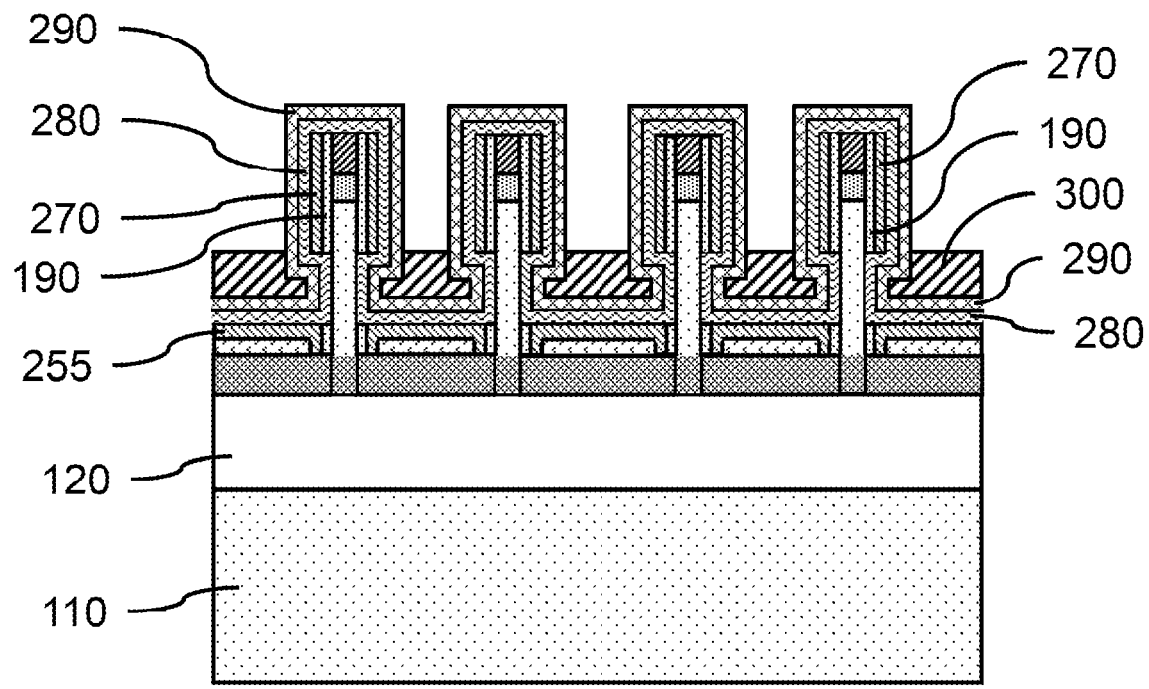
FIG. 17 is a cross-sectional side view of a partially removed temporary fill layer exposing a portion of the protective cover layer, in accordance with an embodiment of the present invention.

FIG. 17 is a cross-sectional side view of a partially removed temporary fill layer exposing a portion of the protective cover layer, in accordance with an embodiment of the present invention.

In one or more embodiments, a portion of the temporary fill layer 300 can be removed to expose a portion of the protective cover layer 290, where the temporary fill layer 300 can be removed by a selective etch. After removal, the top surface of the temporary fill layer 300 can be at or above the lower edge of the inner protective cap 190, so at least the portion of the gate dielectric layer 280 in contact with the vertical fin 131 is covered by the temporary fill layer 300. An upper portion of the protective cover layer 290 on the upper spacer liner 270 can be exposed after removal of the portion of the temporary fill layer 300.

Figure 18:
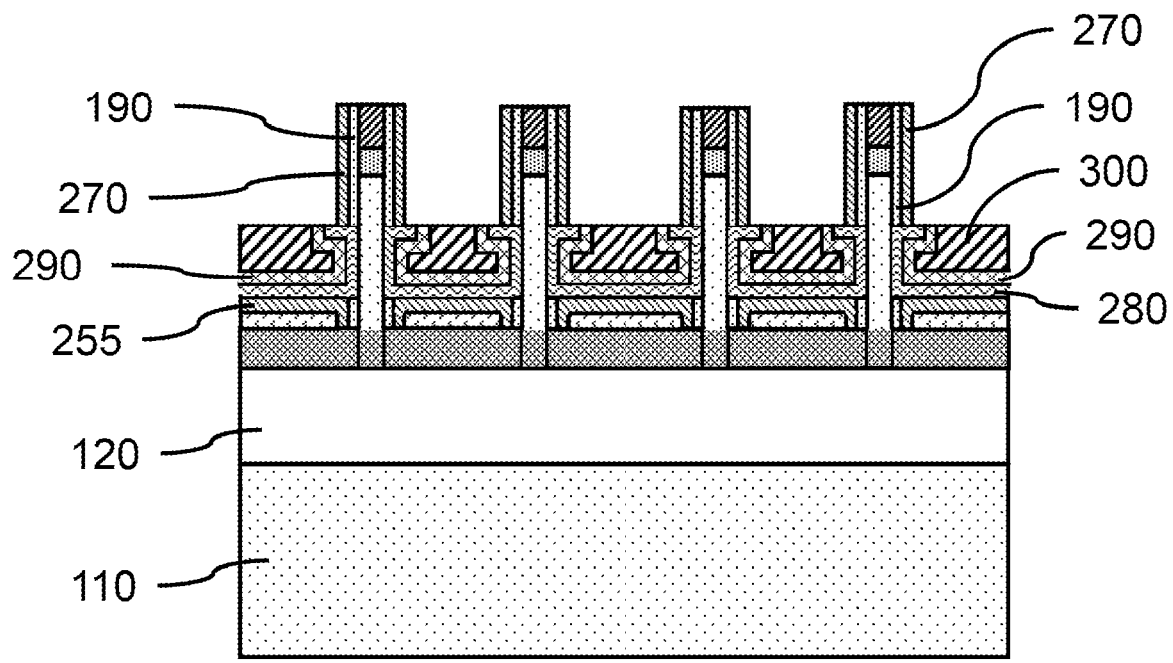
FIG. 18 is a cross-sectional side view of an exposed upper spacer liner after removal of a portion of the gate dielectric layer and protective cover layer, in accordance with an embodiment of the present invention.

FIG. 18 is a cross-sectional side view of an exposed upper spacer liner after removal of a portion of the gate dielectric layer and protective cover layer, in accordance with an embodiment of the present invention.

In one or more embodiments, the exposed portion of the protective cover layer 290 can be removed from the underlying gate dielectric layer 280. The exposed portion of the gate dielectric layer 280 can then be removed to expose the underlying upper spacer liner 270. A portion of the gate dielectric layer 280 can remain on at least a portion of the vertical fin 131 where a gate structure can subsequently be formed. The remaining portion of the gate dielectric layer 280 can be covered by the remaining portion of the protective cover layer 290.

Figure 19:
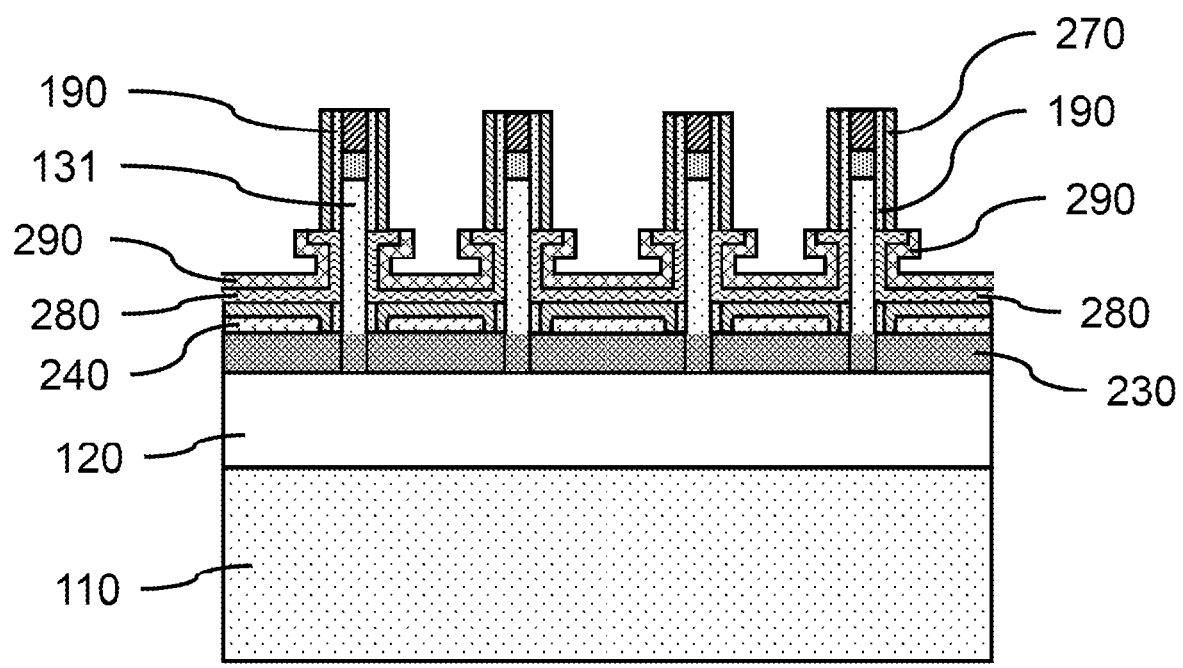
FIG. 19 is a cross-sectional side view of an exposed protective cover layer after removal of the temporary fill layer, in accordance with an embodiment of the present invention.

FIG. 19 is a cross-sectional side view of an exposed protective cover layer after removal of the temporary fill layer, in accordance with an embodiment of the present invention.

In one or more embodiments, the temporary fill layer 300 can be removed to expose the underlying protective cover layer 290. The temporary fill layer 300 can be removed by a selective isotropic etch to remove the portion of the temporary fill layer 300 that can be in the recess formed by the protective cover layer 290 and gate dielectric layer 280.

In one or more embodiments, the lip formed by the protective cover layer 290 and gate dielectric layer 280 protruding perpendicularly away from the vertical fin sidewall can be selectively removed with an isotropic wet etch.

Figure 20:
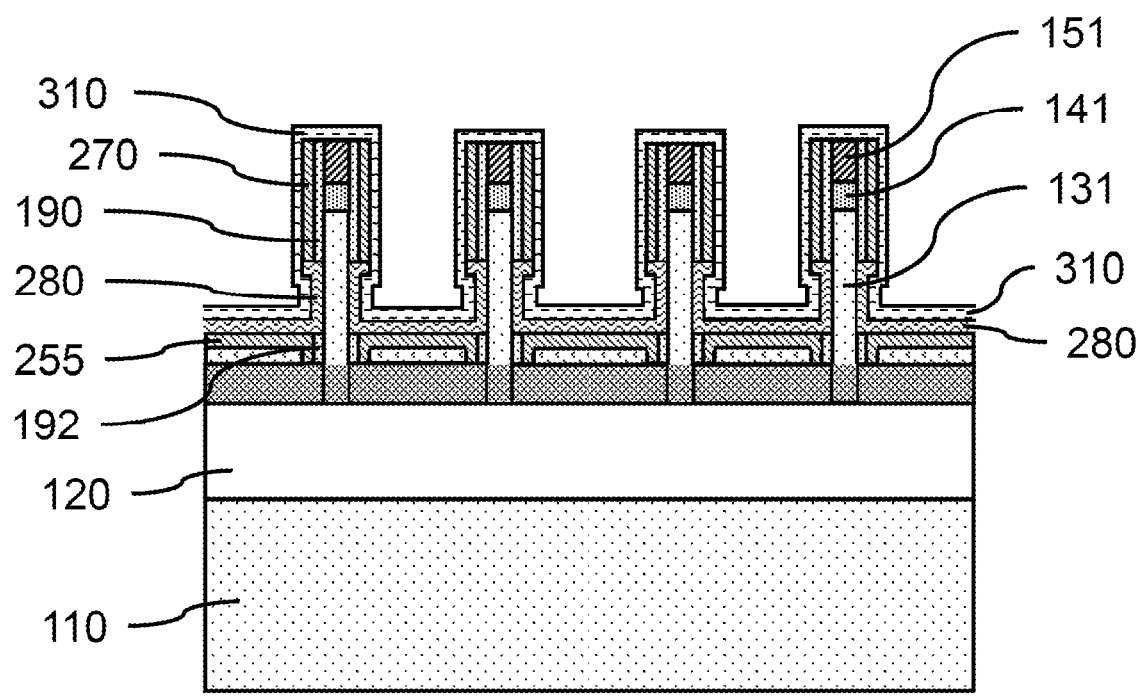
FIG. 20 is a cross-sectional side view of a work function layer on the upper spacer liner and gate dielectric layer, in accordance with an embodiment of the present invention.

FIG. 20 is a cross-sectional side view of a work function layer on the upper spacer liner and gate dielectric layer, in accordance with an embodiment of the present invention.

In one or more embodiments, the protective cover layer 290 can be removed to expose the underlying gate dielectric layer 280 on one or more vertical fin(s) 131, where the protective cover layer 290 can be removed using a selective isotropic wet etch.

In one or more embodiments, a work function layer 310 can be formed on the exposed portions of the gate dielectric layer 280, upper spacer liner 270, and top surfaces of the fin template(s) 151 and inner protective cap 190. The work function layer 310 can be formed by a conformal deposition, for example, ALD, PEALD, CVD, PECVD, and combinations thereof.

In one or more embodiments, a work function layer 310 can be formed on the gate dielectric layer 280 exposed by removal of the protective cover layer 290. The work function layer 310 can be formed on the gate dielectric layer 280 to adjust the electrical properties of a gate electrode. In various embodiments, the work function layer 310 can be optional.

In various embodiments, a work function layer 310 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 310 may include multiple layers of work function materials, for example, a work function layer 310 can be a TiN/TiC stack.

In various embodiments, the work function layer 310 can have a thickness in the range of about 3 nm to about 11 nm, or can have a thickness in the range of about 5 nm to about 8 nm.

Figure 21:
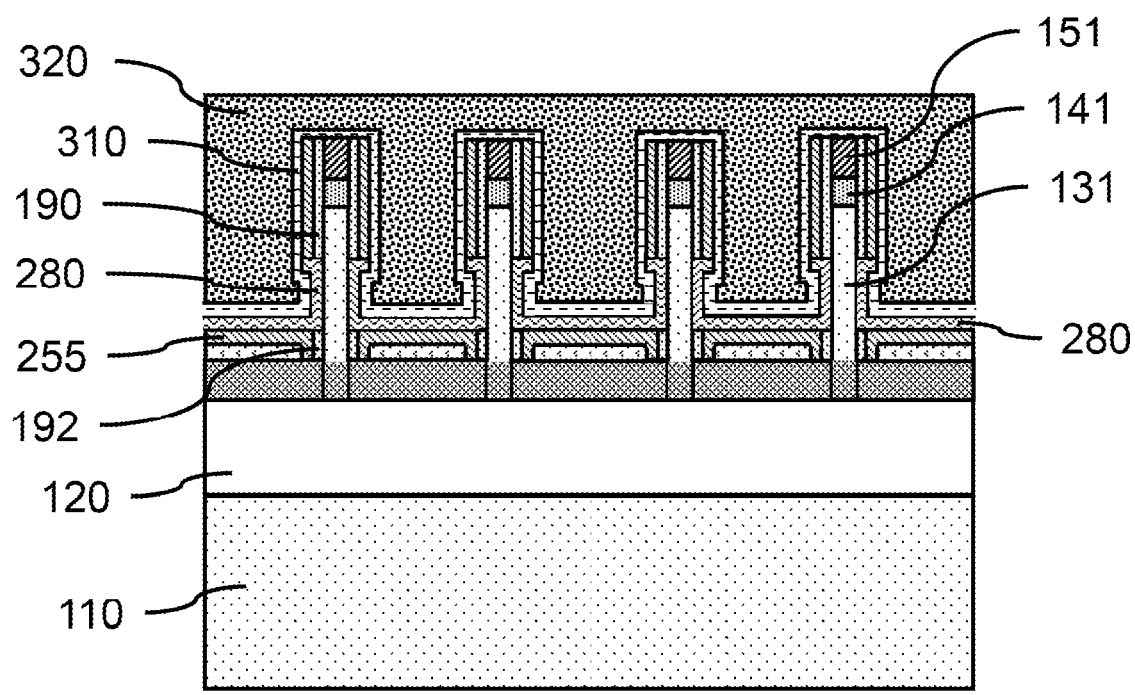
FIG. 21 is a cross-sectional side view of a gate metal fill on the work function layer, in accordance with an embodiment of the present invention.

FIG. 21 is a cross-sectional side view of a gate metal fill on the work function layer, in accordance with an embodiment of the present invention.

In one or more embodiments, a gate metal fill 320 can be formed on at least a portion of the work function layer 310. The gate metal fill 320 can be formed by a blanket deposition, where the gate metal fill 320 can extend above the top surfaces of the work function layer 310 on the fin templates 151. The gate metal fill 320 can fill in the space(s) between the vertical fins 131. A CMP can be used to reduce the height of the gate metal fill 320.

In various embodiments, the gate metal fill 320 can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

Figure 22:
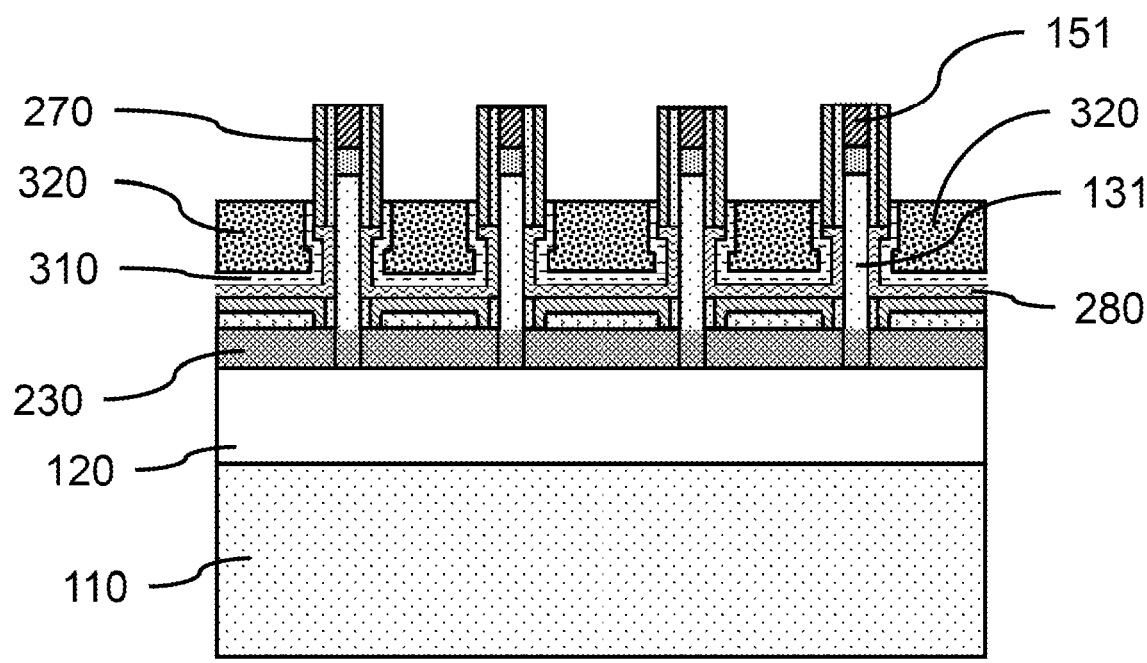
FIG. 22 is a cross-sectional side view of a reduced height gate metal fill on the work function layer, in accordance with an embodiment of the present invention.

FIG. 22 is a cross-sectional side view of a reduced height gate metal fill on the work function layer, in accordance with an embodiment of the present invention.

In one or more embodiments, an exposed portion of the gate metal fill 320 can be removed to reduce the height of the gate metal fill 320. Removal of a portion of the gate metal fill 320 can expose a portion of the work function layer 310.

In one or more embodiments, a portion of the work function layer 310 exposed by the reduction in height of the gate metal fill 320 can be removed, where the exposed portion of the work function layer 310 can be removed by a selective isotropic wet etch. The top surfaces of the gate metal fill 320 and the work function layer 310 can be above the level of the upper-most surface of the gate dielectric layer 280 and below the level of the top surface of the vertical fin(s) 131, where at least a portion of the work function layer 310 can remain on the upper spacer liner 270 after removal of the exposed portion of the work function layer 310.

In one or more embodiments, the gate metal fill 320, work function layer 310, and gate dielectric layer 280 can form a gate structure on at least a portion of one or more vertical fin(s) 131, where the gate metal fill 320 and work function layer 310 can form a conductive gate electrode.

Figure 23:
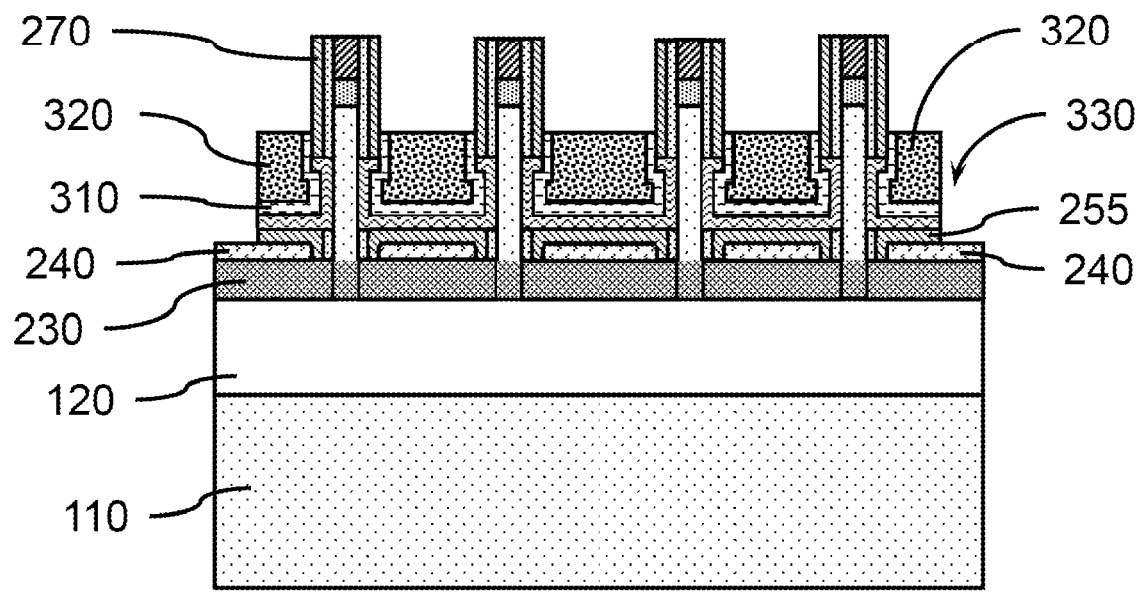
FIG. 23 is a cross-sectional side view of a recessed gate metal fill, work function layer, gate dielectric layer, and sacrificial spacer cap, in accordance with an embodiment of the present invention.

FIG. 23 is a cross-sectional side view of a recessed gate metal fill, work function layer, gate dielectric layer, and sacrificial spacer cap, in accordance with an embodiment of the present invention.

In one or more embodiments, a portion of the gate metal fill 320, work function layer 310, gate dielectric layer 280, and sacrificial spacer cap 255 can be removed to reduce the lateral dimensions of the gate structure and sacrificial spacer cap on one or more vertical fin(s) 131 to form a recessed region 330. In various embodiments, the sacrificial bottom spacer 240 may not be partially removed by formation of the recess region(s) 330, such that at least a portion of the top surface of the sacrificial bottom spacer 240 can be exposed by formation of the recessed region(s) 330. The sacrificial bottom spacer 240 can act as an etch stop.

Figure 24:
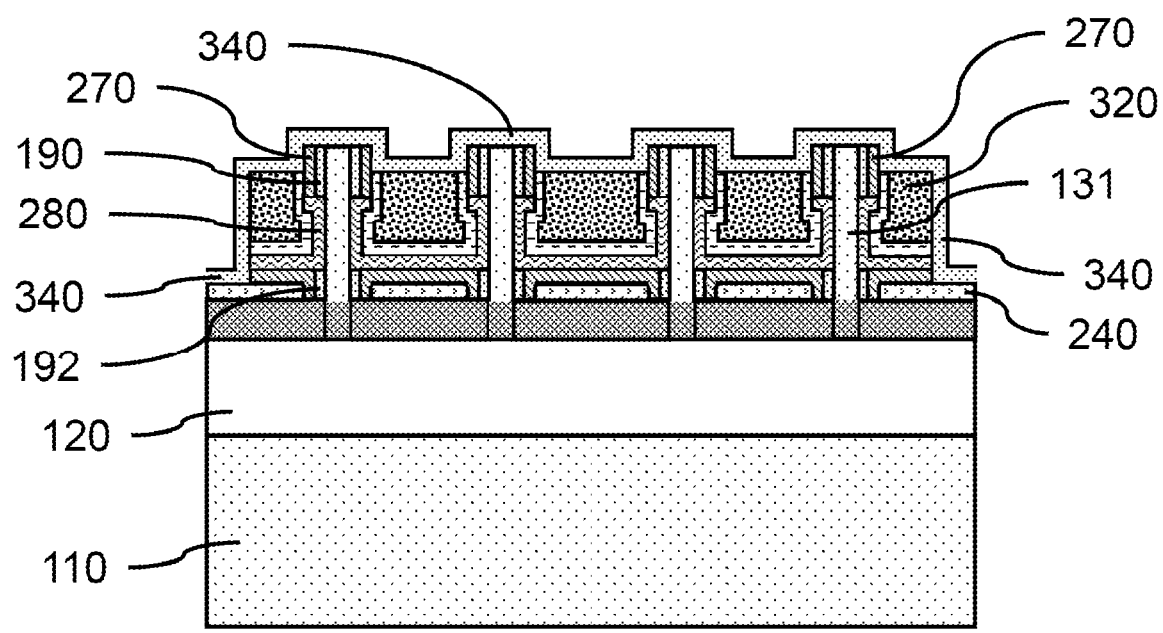
FIG. 24 is a cross-sectional side view of an inner liner on a recessed gate metal fill, work function layer, gate dielectric layer, and sacrificial spacer cap, in accordance with an embodiment of the present invention.

FIG. 24 is a cross-sectional side view of an inner liner on a recessed gate metal fill, work function layer, gate dielectric layer, and sacrificial spacer cap, in accordance with an embodiment of the present invention.

In one or more embodiments, the fin template(s) 151, template liners 141, and a portion of the inner protective cap 190 and upper spacer liner 270 can be removed, where the fin template(s) 151, template liners 141, and a portion of the inner protective cap 190 and upper spacer liner 270 can be removed by CMP. The CMP can provide a smooth, flat surface at the top of the vertical fin(s) 131. In various embodiments, a portion of the vertical fin(s) 131 can also be removed, such that the height of the vertical fin(s) 131 can be reduced by the CMP.

In one or more embodiments, an inner liner 340 can be formed on the top surface of the vertical fin(s) 131, inner protective cap 190, upper spacer liner 270, and at least a portion of the sacrificial bottom spacer 240, where the inner liner 340 can be conformally deposited. In various embodiments, the inner liner 340 can be silicon oxide (SiO) or silicon oxynitride (SiON), where the inner liner 340 can be selectively removed in relation to the inner protective cap 190, upper spacer liner 270, and sacrificial bottom spacer 240.

Figure 25:
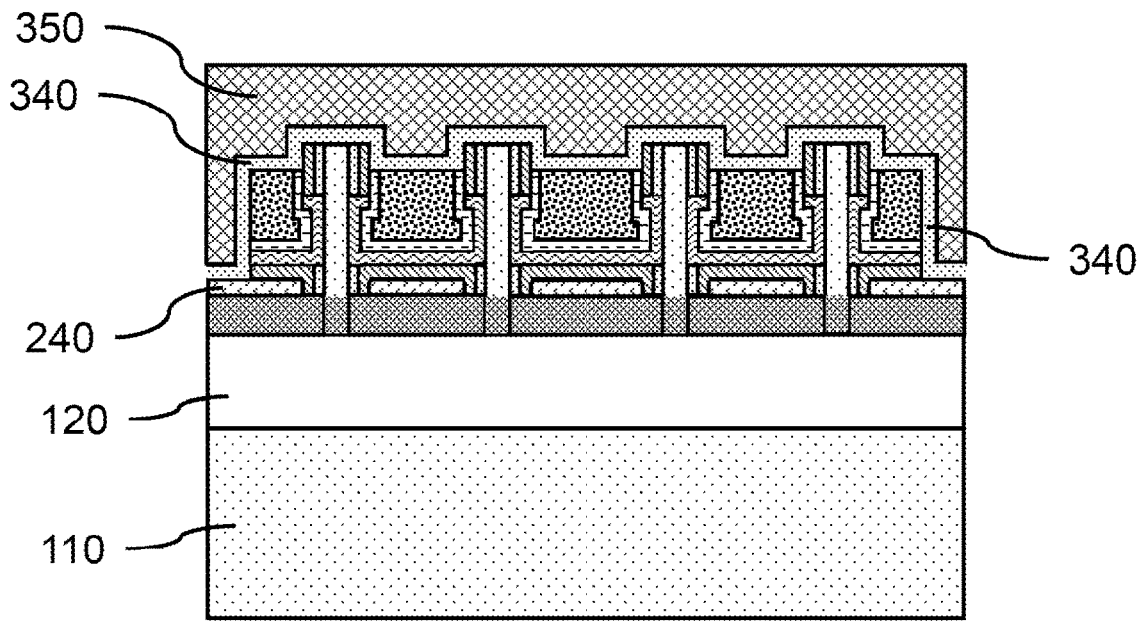
FIG. 25 is a cross-sectional side view of a sacrificial top spacer fill on the inner liner over the vertical fins and gate structures, in accordance with an embodiment of the present invention.

FIG. 25 is a cross-sectional side view of a sacrificial top spacer fill on the inner liner over the vertical fins and gate structures, in accordance with an embodiment of the present invention.

In one or more embodiments, a sacrificial top spacer fill 350 can be formed on the inner liner 340, where the sacrificial top spacer fill 350 can be blanket deposited on the inner liner 340 over the vertical fins 131 and gate structures.

In one or more embodiments, the sacrificial top spacer fill 350 can be an easily selectively etchable material, for example, silicon nitride (SiN), amorphous carbon (a-C), amorphous silicon (a-Si), silicon-germanium (SiGe), or suitable combinations thereof.

Figure 26:
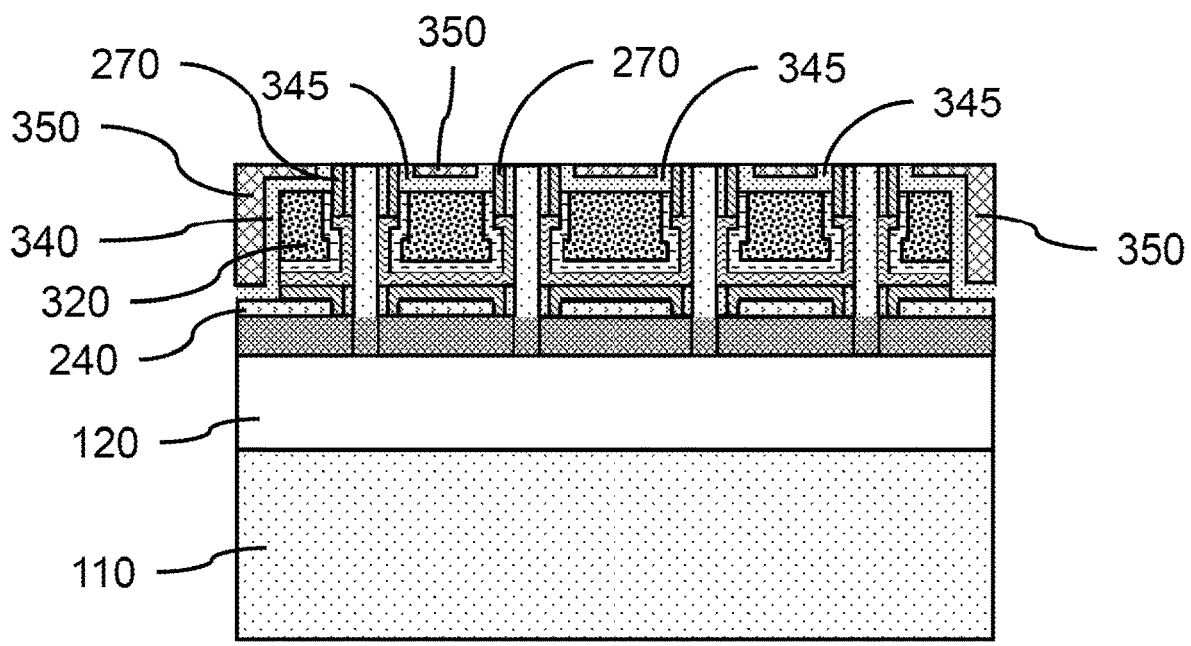
FIG. 26 is a cross-sectional side view of a reduced height sacrificial top spacer fill on the inner liner after partial removal, in accordance with an embodiment of the present invention.

FIG. 26 is a cross-sectional side view of a reduced height sacrificial top spacer fill on the inner liner after partial removal, in accordance with an embodiment of the present invention.

In one or more embodiments, the sacrificial top spacer fill 350 can be partially removed to expose the top surfaces of the vertical fin(s) 131, inner protective cap 190, and upper spacer liner 270. A portion of the inner liner 340 can be exposed by removal of the portion of the sacrificial top spacer fill 350. The sacrificial top spacer fill 350 can be partially removed by chemical-mechanical polishing (CMP) to provide a smooth flat surface, while leaving a portion of the sacrificial top spacer fill 350 in U-shaped trough(s) 345 formed by the inner liner 340 between adjacent upper spacer liners 270.

Figure 27:
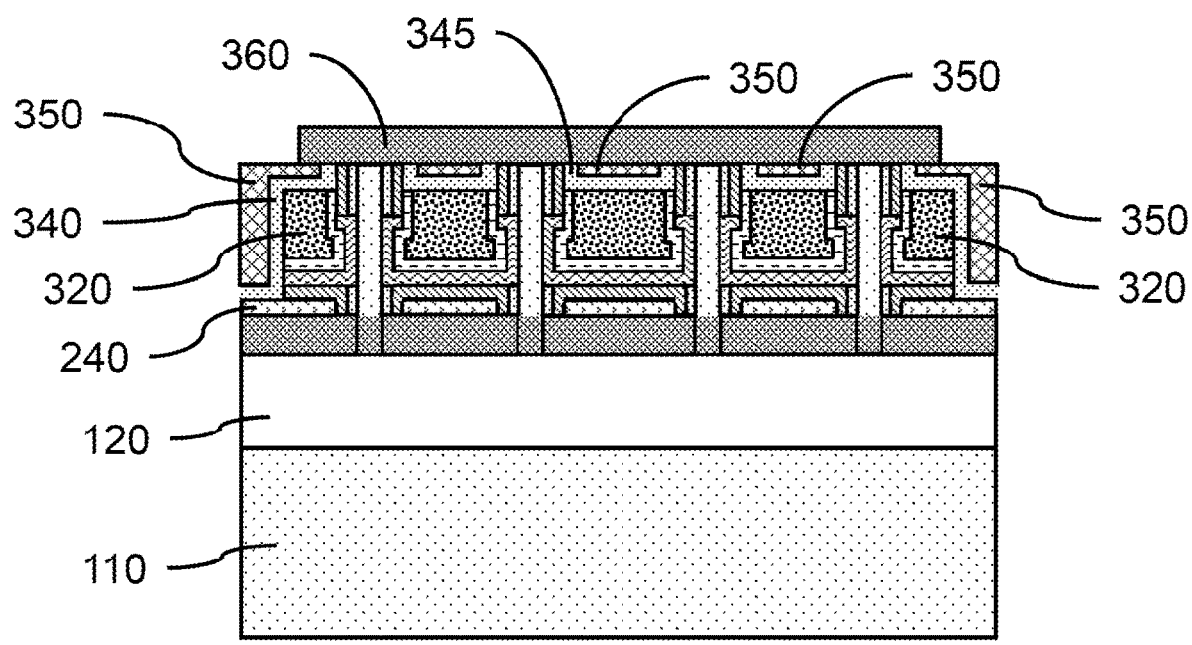
FIG. 27 is a cross-sectional side view of a top source/drain region on the top surfaces of the vertical fins and sacrificial top spacer fill, in accordance with an embodiment of the present invention.

FIG. 27 is a cross-sectional side view of a top source/drain region on the top surfaces of the vertical fins and sacrificial top spacer fill, in accordance with an embodiment of the present invention.

In one or more embodiments, a top source/drain 360 can be formed on the exposed top surfaces of the vertical fins 131 and sacrificial top spacer fill 350 in the U-shaped trough(s) 345. The top source/drain 360 can be formed by epitaxially growing source/drain region(s) on one or more vertical fin(s) 131. In various embodiments, the source/drain region(s) can be grown on two or more adjacent vertical fins 131 until the source/drain regions coalesce into a merged top source/drain 360 that spans two or more vertical fins 131 and covers at least one U-shaped trough 345 with a sacrificial top spacer fill 350 in the trough bed.

Figure 28:
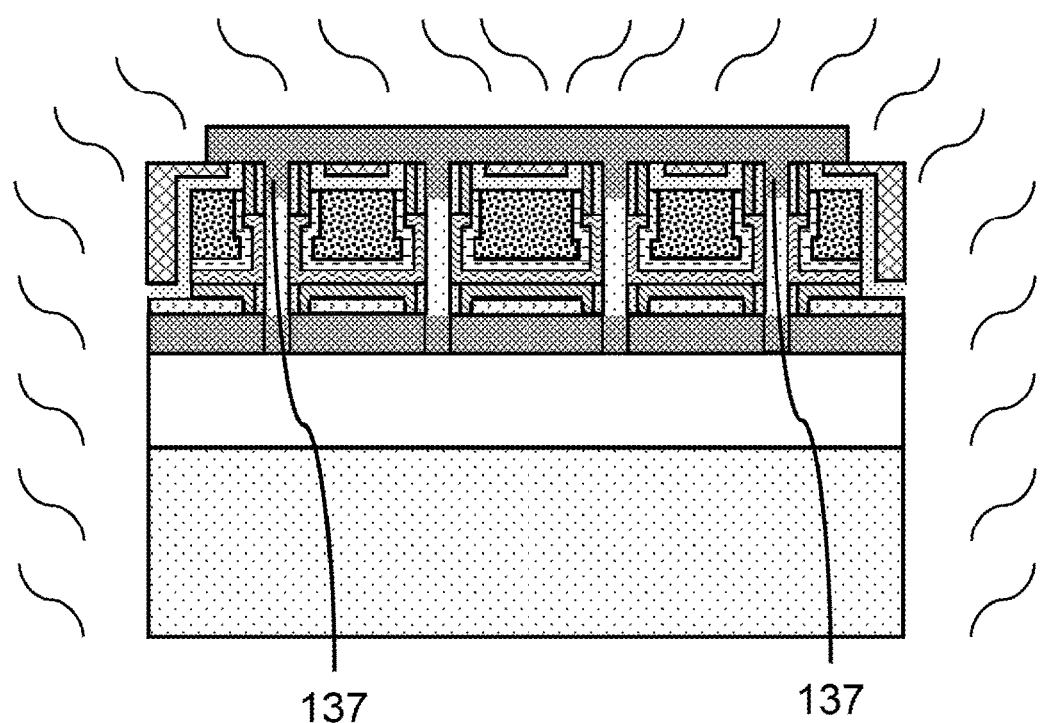
FIG. 28 is a cross-sectional side view of dopant diffusion into an upper portion of the vertical fins utilizing a heat treatment, in accordance with an embodiment of the present invention.

FIG. 28 is a cross-sectional side view of dopant diffusion into an upper portion of the vertical fins utilizing a heat treatment, in accordance with an embodiment of the present invention.

In one or more embodiments, the vertical fin(s) 131 and top source/drain 360 can be heat treated to facilitate diffusion of dopant from the top source/drain 360 into the adjacent vertical fin(s) 131. In various embodiments, the top source/drain 360 and vertical fin(s) 131 can be heat treated at a temperature in the range of about 700° C. to about 1300° C., or in the range of about 900° C. to about 1100° C., where the heat treatment can be a furnace anneal, a rapid thermal anneal, or a laser anneal. In various embodiments the anneal can be for a duration in the range of about 5 seconds to about 1 hour, where the duration of the heat treatment can depend upon the temperature.

In various embodiments, the top source/drain 360 can have a dopant concentration in the range of about $1\times10^{19}$ to about $1\times10^{21}$, or in the range of about $5\times10^{19}$ to about $5\times10^{20}$. The top diffusion region 137 in the upper portion of the vertical fin(s) 131 can have a dopant concentration in the range of about $1\times10^{18}$ to about $1\times10^{20}$, or in the range of about $5\times10^{18}$ to about $5\times10^{19}$, after the heat treatment.

Figure 29:
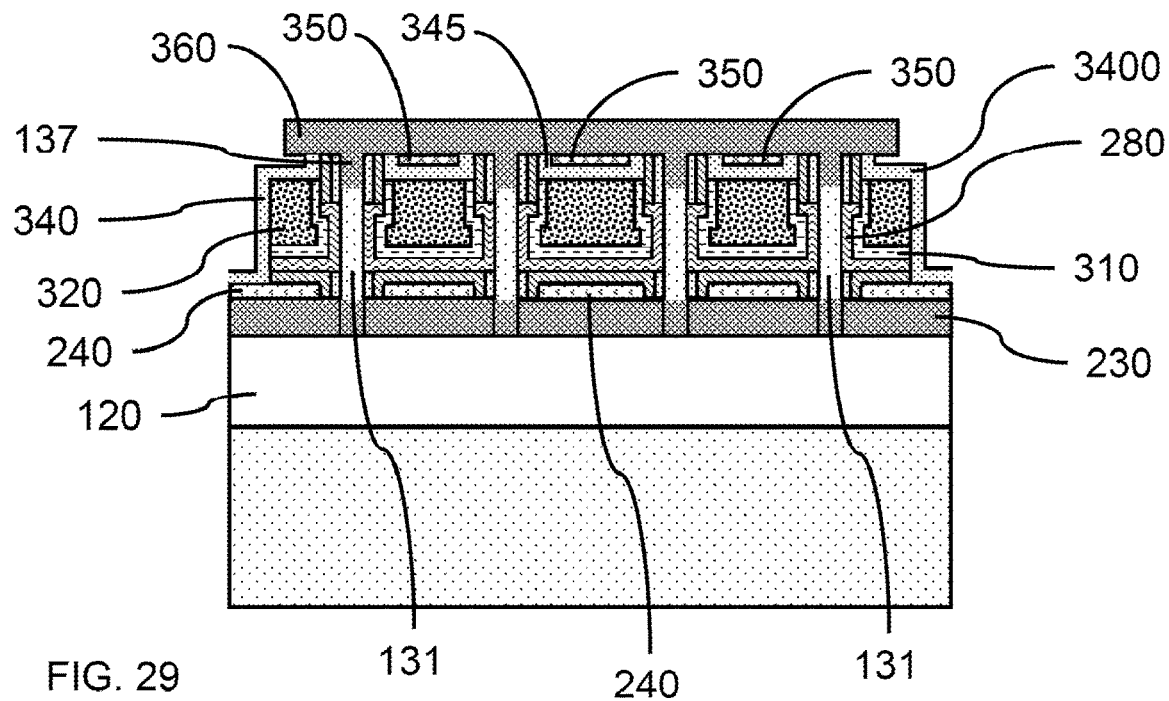
FIG. 29 is a cross-sectional side view of a top source/drain on the vertical fins after removal of the exposed portion of the sacrificial top spacer fill, in accordance with an embodiment of the present invention.

FIG. 29 is a cross-sectional side view of a top source/drain on the vertical fins after removal of the exposed portion of the sacrificial top spacer fill, in accordance with an embodiment of the present invention.

In one or more embodiments, a portion of the sacrificial top spacer fill 350 not covered by the top source/drain 360 can be removed to expose a portion of the inner liner 340, whereas the portion(s) of the sacrificial top spacer fill 350 in the U-shaped trough 345 can remain.

Figure 30:
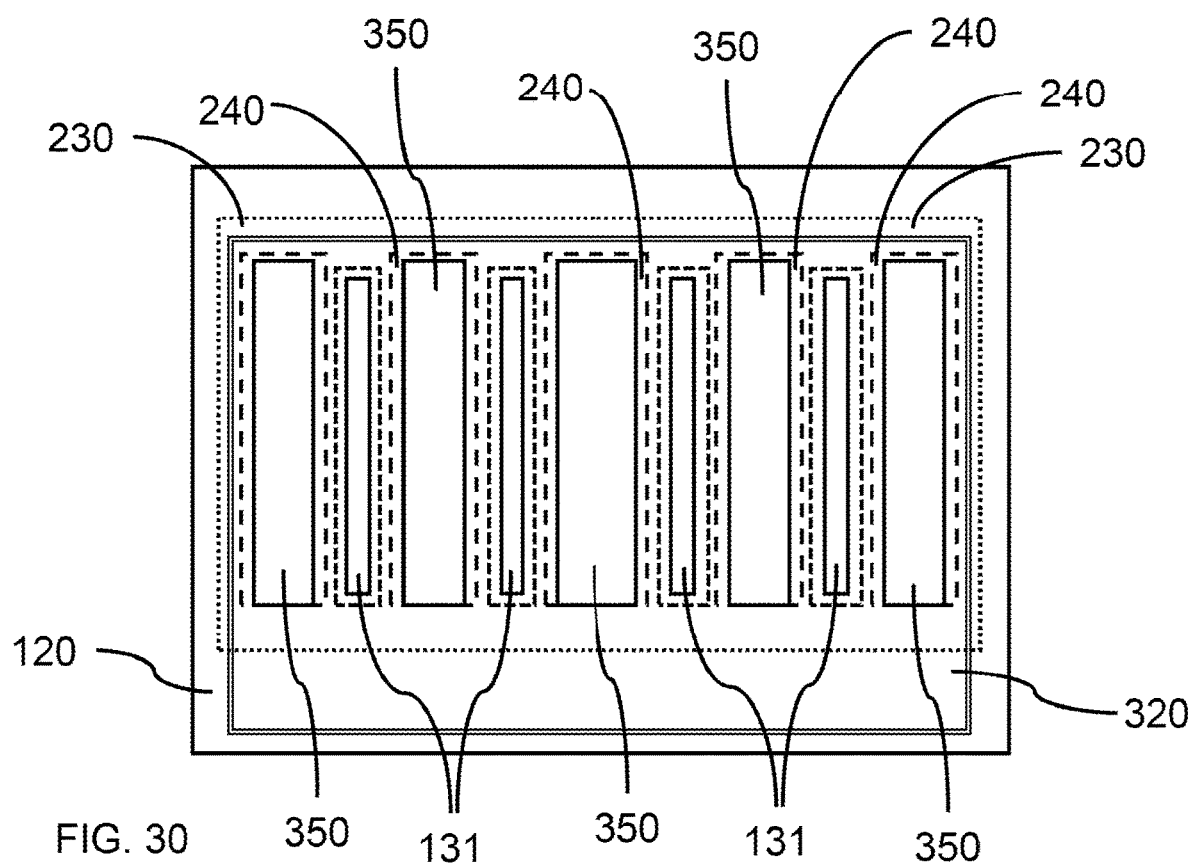
FIG. 30 is a top view of a fin layout showing hidden features, in accordance with an embodiment of the present invention.

FIG. 30 is a layered top view of a fin layout showing an arrangement of hidden features, in accordance with an embodiment of the present invention.

In various embodiments, a vertical finFET device can be laid out on a buried oxide layer 120, where the surface of the BOX layer can extend laterally beyond the formed features of the device. A source/drain layer 230 (shown as a dotted line) formed on the buried oxide layer 120 can extend laterally outward away from the vertical fin(s) 131 (shown as solid lines) and gate metal fill 320 (shown as a double solid line), so an electrical contact can be formed past the higher device layers to the source/drain layer 230 without interference or shorting to other device components. The gate metal fill 320 can extend laterally past one end of the vertical fin(s) 131, and sacrificial top spacer fill 350, so an electrical contact can be formed past these device layers. Sacrificial bottom spacer(s) 240 (shown as long dashed lines) can be on the source/drain layer 230, and below the gate metal fill 320.

The sacrificial top spacer fill 350 (shown as solid lines) can be above the gate metal fill 320, and smaller laterally than the sacrificial bottom spacer(s) 240 by approximately the sidewall width of the U-shaped trough 345 (not shown). The sacrificial top spacer fill 350 can be longer than the vertical fin(s) 131 in at least one direction, such that a vertical opening can be made to the sacrificial top spacer fill 350 without exposing an endwall of the vertical fin(s). The vertical fin(s) 131 can also be surrounded by an inner protective liner 190 and upper spacer liner 270 (shown together as a short dashed line around the vertical fin(s) 131).

The inner liner 340 can cover the sacrificial bottom spacer(s) 240, gate metal fill 320, and a portion of the endwalls of the vertical fin(s) 131, while leaving the sacrificial top spacer fill 350 uncovered. The inner liner 340 can protect the covered device components and layers during formation of a vertical opening and etching of the sacrificial top spacer fill 350.

Figure 31:
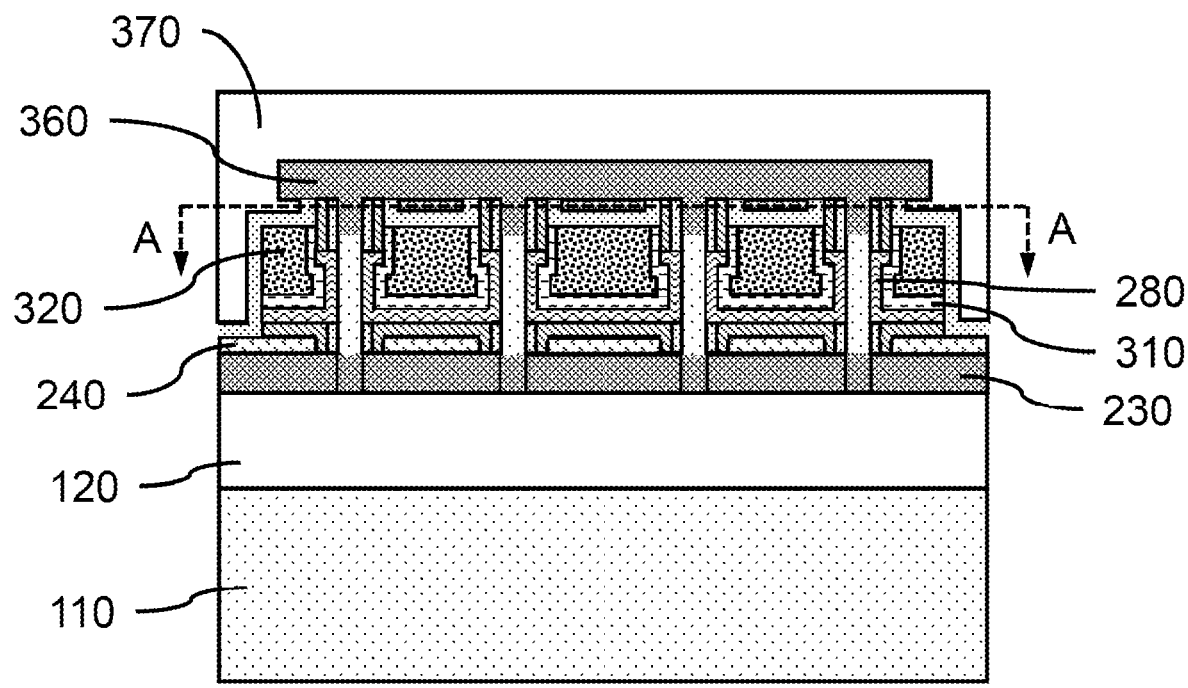
FIG. 31 is a cross-sectional side view of an interlayer dielectric layer on the top source/drain and previously exposed inner liner, in accordance with an embodiment of the present invention.

FIG. 31 is a cross-sectional side view of an interlayer dielectric layer on the top source/drain and previously exposed inner liner, in accordance with an embodiment of the present invention.

In one or more embodiments, an interlayer dielectric (ILD) layer 370 can be formed on the top source/drain(s) 360 and on the portions of the inner liner 340 exposed by removal of the sacrificial top spacer fill 350.

In one or more embodiments, the interlayer dielectric layer 370 can be a silicon oxide (SiO) or a low-k dielectric material. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

In various embodiments, the ILD layer 370 can be blanket deposited on the top source/drain 360. In various embodiments, the ILD layer 370 can be formed by CVD, LPCVD, or spun on.

Figure 32:
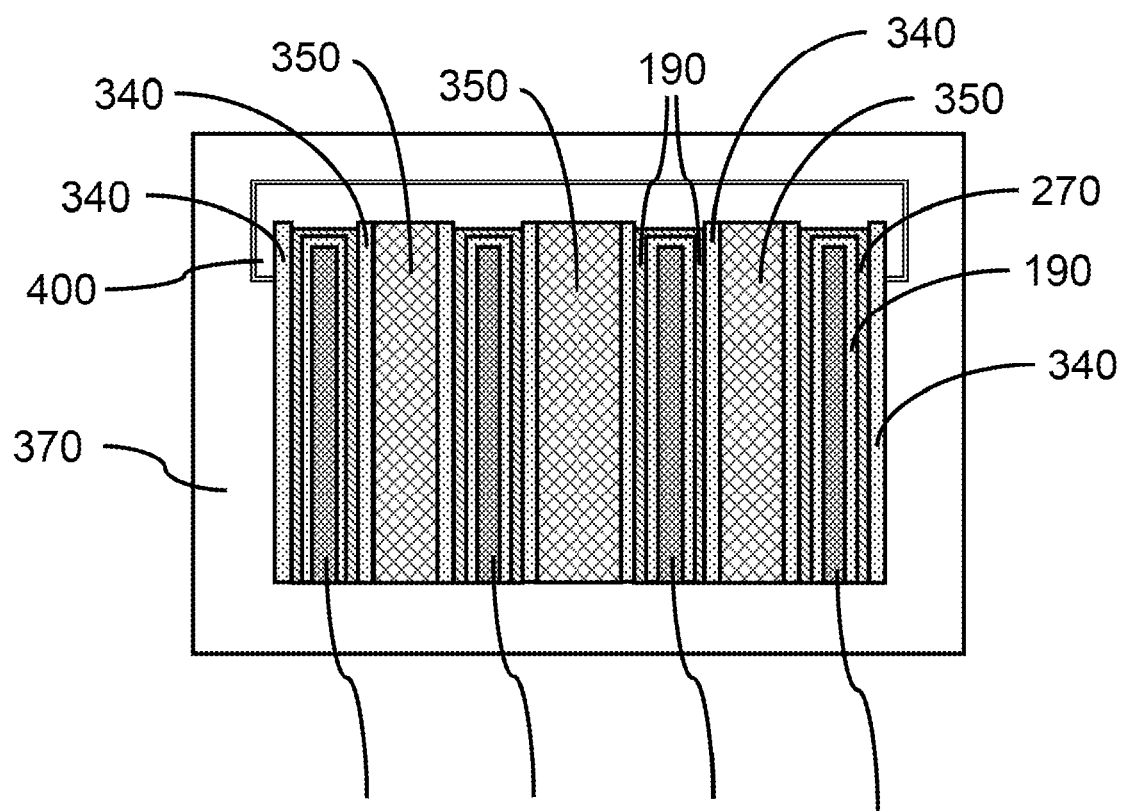
FIG. 32 is a cross-sectional top view of FIG. 31 along the AA section showing a plurality of vertical fins and intervening sacrificial top spacer fill in the U-shaped troughs with an opening in the ILD layer, in accordance with an embodiment of the present invention.

FIG. 32 is a cross-sectional top view of FIG. 31 along the AA section showing a plurality of vertical fins and intervening sacrificial top spacer fill in the U-shaped troughs with an opening in the ILD layer, in accordance with an embodiment of the present invention.

In one or more embodiments, an opening 400 can be formed in the ILD layer 370, where the opening extends from the top surface of the ILD layer 370 to a depth that exposes at least a portion of the sacrificial top spacer fill 350 at one end of the vertical fins 131. Different openings 400 can be formed to different U-shaped troughs 345.

Figure 33:
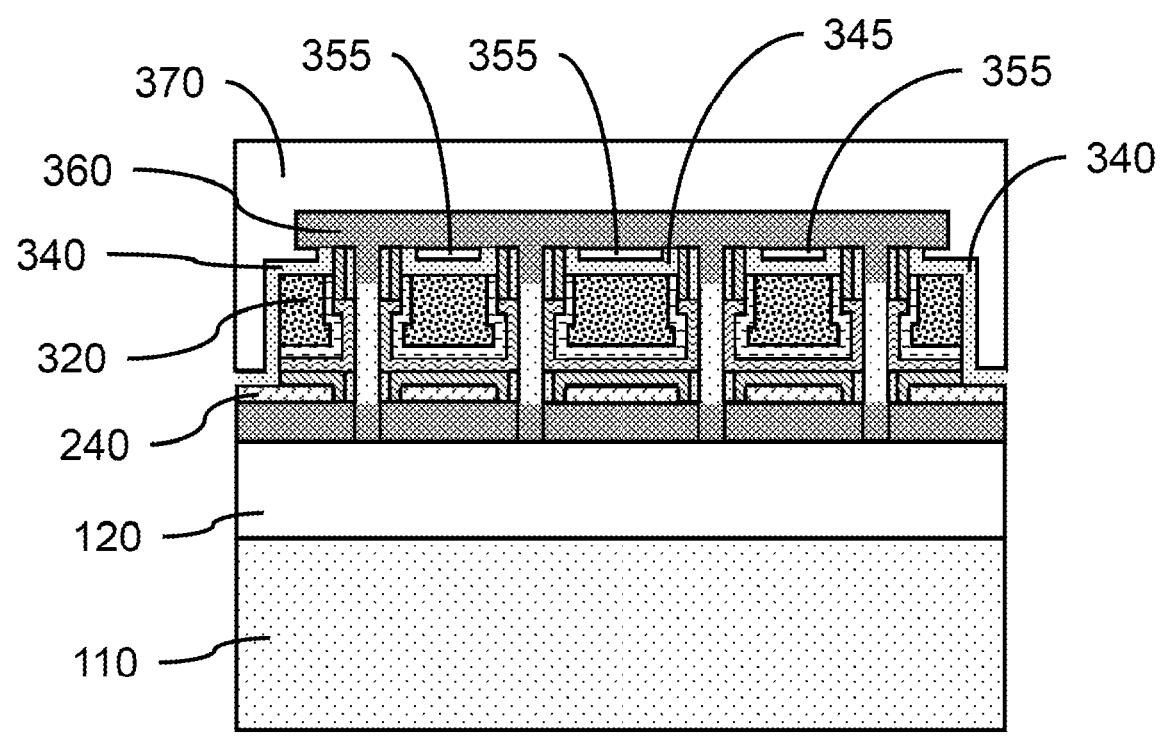
FIG. 33 is a cross-sectional side view of upper void spaces formed in the U-shaped troughs after removal of the sacrificial top spacer fill, in accordance with an embodiment of the present invention.

FIG. 33 is a cross-sectional side view of upper void spaces formed in the U-shaped troughs after removal of the sacrificial top spacer fill, in accordance with an embodiment of the present invention.

In one or more embodiments, an isotropic etchant selective for the material of the sacrificial top spacer fill material can be introduced into the opening 400 formed in the ILD layer 370, such that the sacrificial top spacer fill 350 can be selectively removed from within the U-shaped troughs 345 to form upper void space(s) 355, which can be air gaps between a top source/drain 360 and a gate structure in a finFET device.

Figure 34:
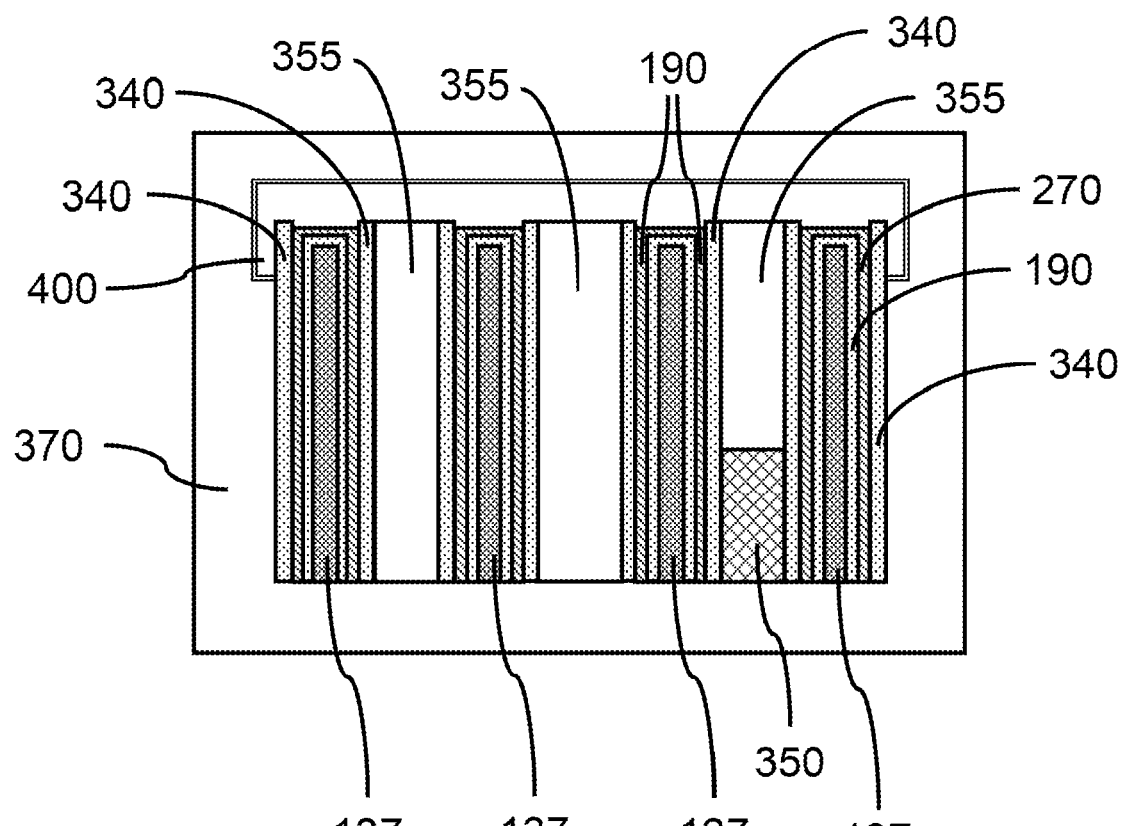
FIG. 34 is a cross-sectional top view of FIG. 33 along the same AA section as FIG. 31 showing a plurality of vertical fins and upper void spaces in the U-shaped troughs, in accordance with an embodiment of the present invention.

FIG. 34 is a cross-sectional top view of FIG. 33 along the same AA section as FIG. 31 showing a plurality of vertical fins and upper void spaces in the U-shaped troughs, in accordance with an embodiment of the present invention.

In one or more embodiments, the upper void space(s) 355 can extend along the full length of the U-shaped troughs 345 from one end of the vertical fin 131 to the other end of the vertical fin. In various embodiments, the upper void space(s) 355 can extend along a portion of the length of the U-shaped troughs 345 from the end proximal to the opening in the ILD layer at which the isotropic etchant is introduced to a point only partially along the length of the vertical fin 131. A portion of the sacrificial top spacer fill 350 can remain in the U-shaped troughs 345 at the distal end from the opening in the ILD layer 370. Inner liner 340 can cover components below the sacrificial top spacer fill.

In various embodiments, the opening 400 can be back-filled with an ILD material, where the ILD back-fill can pinch off a portion of the void space(s) 355 (e.g., air gap) proximal to the opening 400.

Figure 35:
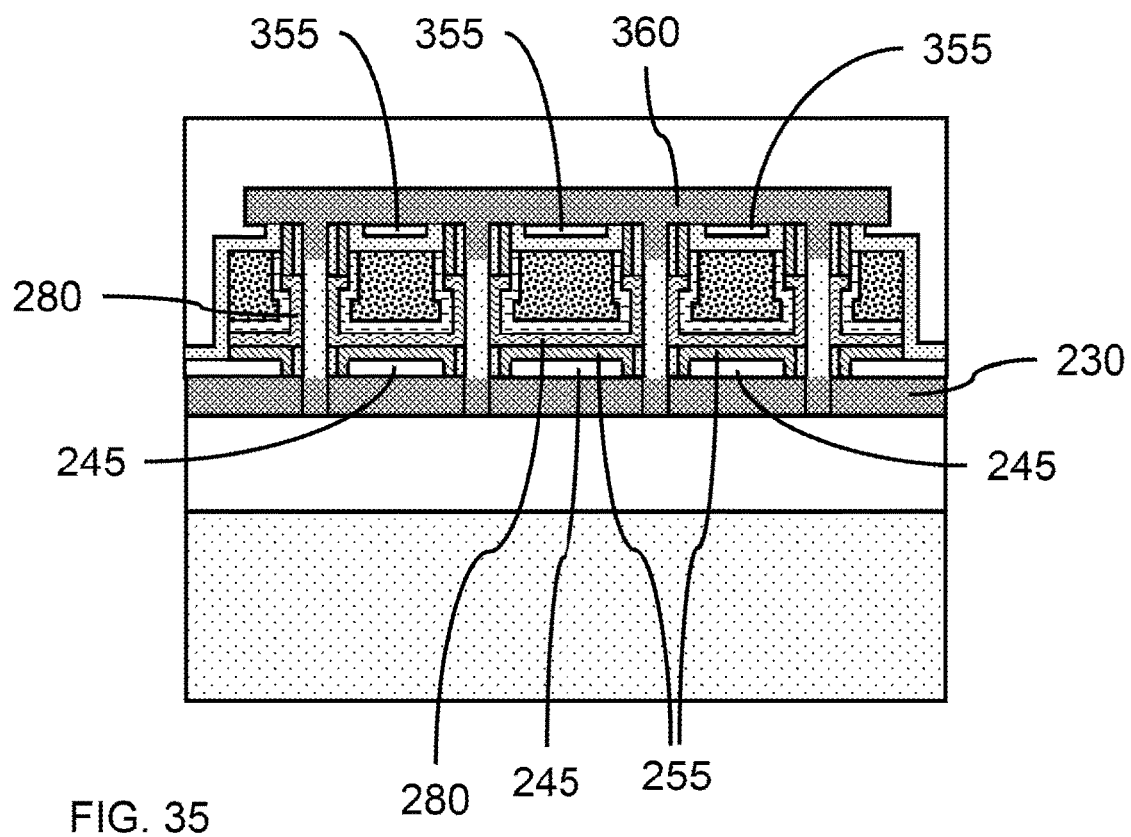
FIG. 35 is a cross-sectional side view of bottom void spaces formed in the U-shaped sacrificial spacer caps after removal of the sacrificial bottom spacer, in accordance with an embodiment of the present invention.

FIG. 35 is a cross-sectional side view of bottom void spaces formed in the U-shaped sacrificial spacer caps after removal of the sacrificial bottom spacer, in accordance with an embodiment of the present invention.

In one or more embodiments, an opening can be formed in the ILD layer 370, where the opening extends from the top surface of the ILD layer 370 to a depth that exposes at least a portion of the sacrificial bottom spacer 240 at one end of the vertical fins 131.

In one or more embodiments, an isotropic etchant selective for the material of the sacrificial bottom spacer 240 can be introduced into the opening formed in the ILD layer 370, such that the sacrificial bottom spacer 240 can be selectively removed from within the U-shaped sacrificial spacer cap 255 to form bottom void space(s) 245, which can be air gaps between a source/drain layer 230 and a gate structure in a finFET device. The sacrificial spacer cap 255 can be on at least a portion of the source/drain layer 230 and in contact with at least a portion of the gate dielectric layer 280, wherein a sacrificial spacer cap 255 bounds the bottom void space 245 on three sides and the source/drain layer 230 bounds the bottom void space 245 on the fourth side.

In one or more embodiments, the bottom void space(s) 245 can extend along the full length of the U-shaped sacrificial spacer cap 255 from one end of the vertical fin 131 to the other end of the vertical fin. In various embodiments, the bottom void space(s) 245 can extend along a portion of the length of the U-shaped sacrificial spacer cap 255 from the end proximal to the opening in the ILD layer 370 at which the isotropic etchant is introduced to a point only partially along the length of the vertical fin 131. A portion of the sacrificial bottom spacer 240 can remain in the sacrificial spacer cap 255 at the distal end from the opening in the ILD layer 370, where removal can be a timed etch.

In various embodiments, separate openings in the ILD layer 370 can be used to introduced etchant to remove the sacrificial bottom spacer 240 and the sacrificial top spacer fill 350. In various embodiments, opening 400 can be used to introduce etchant to remove the sacrificial top spacer fill 350, whereas a second opening can be used to introduce etchant to remove the sacrificial bottom spacer 240.

Figure 36:
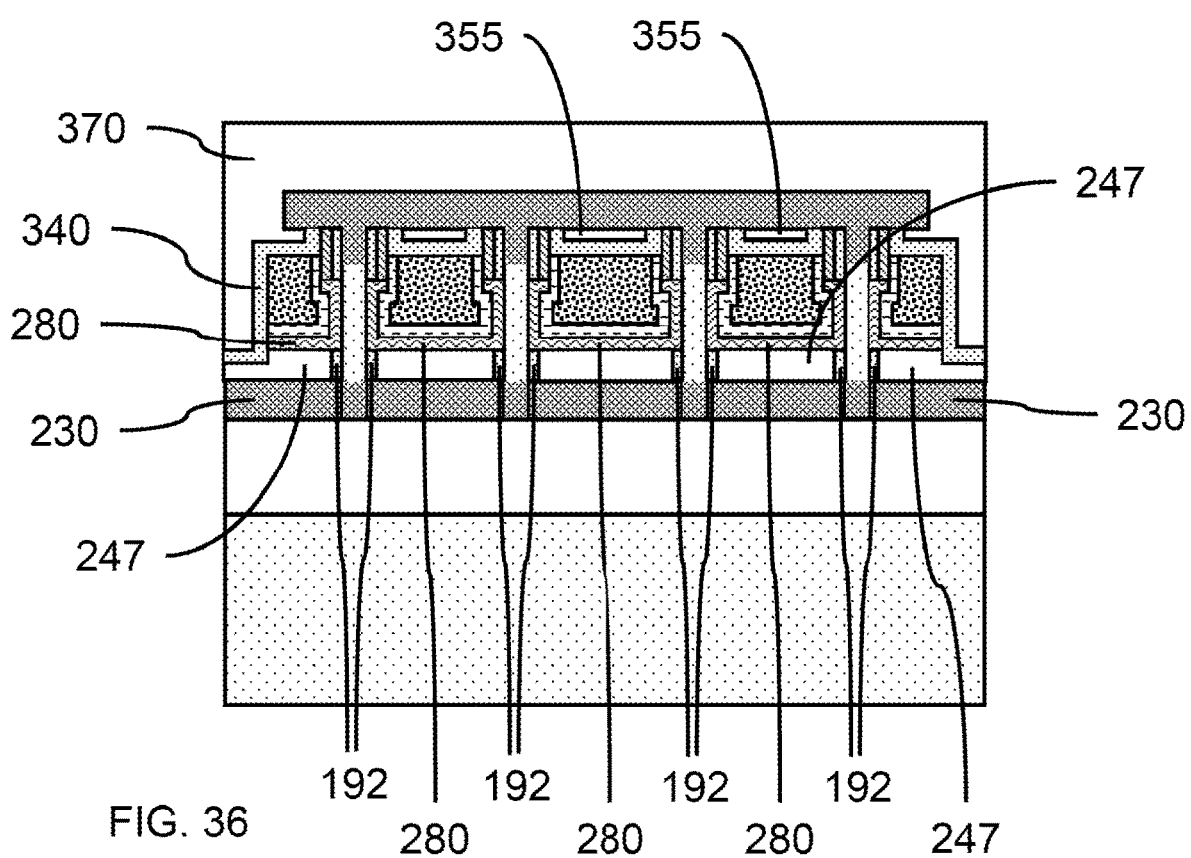
FIG. 36 is a cross-sectional side view of enlarged bottom void spaces formed between the gate dielectric layer and source/drain layer after removal of the sacrificial spacer cap, in accordance with an embodiment of the present invention.

FIG. 36 is a cross-sectional side view of enlarged bottom void spaces formed between the gate dielectric layer and source/drain layer after removal of the sacrificial spacer cap, in accordance with an embodiment of the present invention.

In one or more embodiments, the bottom void space(s) 245 can be enlarged by removing the sacrificial spacer cap(s) 255, where the sacrificial spacer cap(s) 255 can be removed by a selective etch introduced into an opening in the ILD layer 370. The enlarged bottom void space(s) 247 can be bordered by the gate dielectric layer 280, the source/drain layer 230 opposite the gate dielectric layer 280, and the inner protective flanges 192 on the lower portion of the vertical fin 131. The gate dielectric layer 280 can extend laterally between adjacent vertical fins 131 to form a cover over each of the enlarged bottom void space(s) 247, and the inner protective flanges 192 can form sidewalls around the enlarged bottom void space(s) 247. The sacrificial spacer cap(s) 255 can be a different material than the gate dielectric layer 280, the source/drain layer 230, and the inner protective flanges 192, so the sacrificial spacer cap(s) 255 can be selectively removed.

Figure 37:
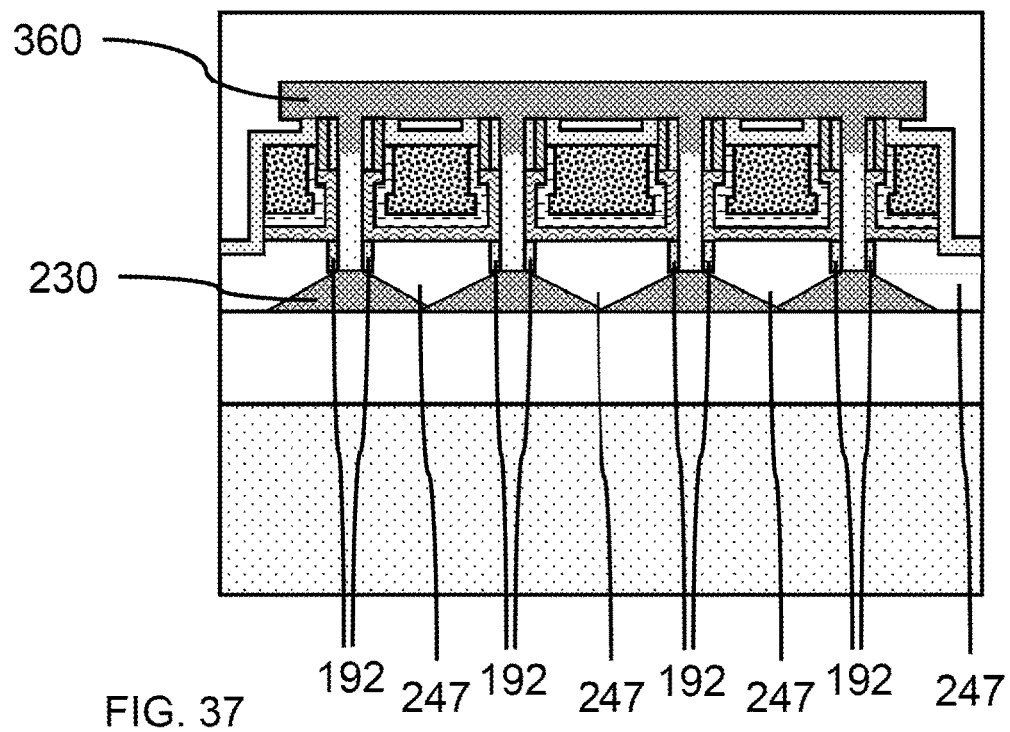
FIG. 37 is a cross-sectional side view of further enlarged bottom void spaces formed by partial removal of the source/drain layer, in accordance with an embodiment of the present invention.

FIG. 37 is a cross-sectional side view of further enlarged bottom void spaces formed by partial removal of the source/drain layer, in accordance with an embodiment of the present invention.

In one or more embodiments, a portion of the source/drain layer 230 can be removed, where an etchant selective for the material of the source/drain layer 230 can be introduced into the enlarged bottom void space(s) 247 to selectively etch the source/drain layer 230 to further enlarge the bottom void space(s) 247. The source/drain layer 230 can be etched using a hydroxide etchant to form angled faces along particular crystal planes to increase the size of the void spaces 247, while maintaining an electrical connection along the source/drain layer 230 to each vertical fin 131.

In a non-limiting exemplary embodiment, a potassium hydroxide solution (KOH) or ammonium hydroxide solution (NH$_4$OH) can be introduced into the enlarged bottom void space(s) 247, where the KOH preferentially etches silicon <100> and <110> crystal planes compared to the <111> crystal plane, thereby forming facetted sides on the source/drain layer 230. The facetted sides can be at an angle to the vertical fin(s) 131 and not parallel to the plane of the substrate.

Figure 38:
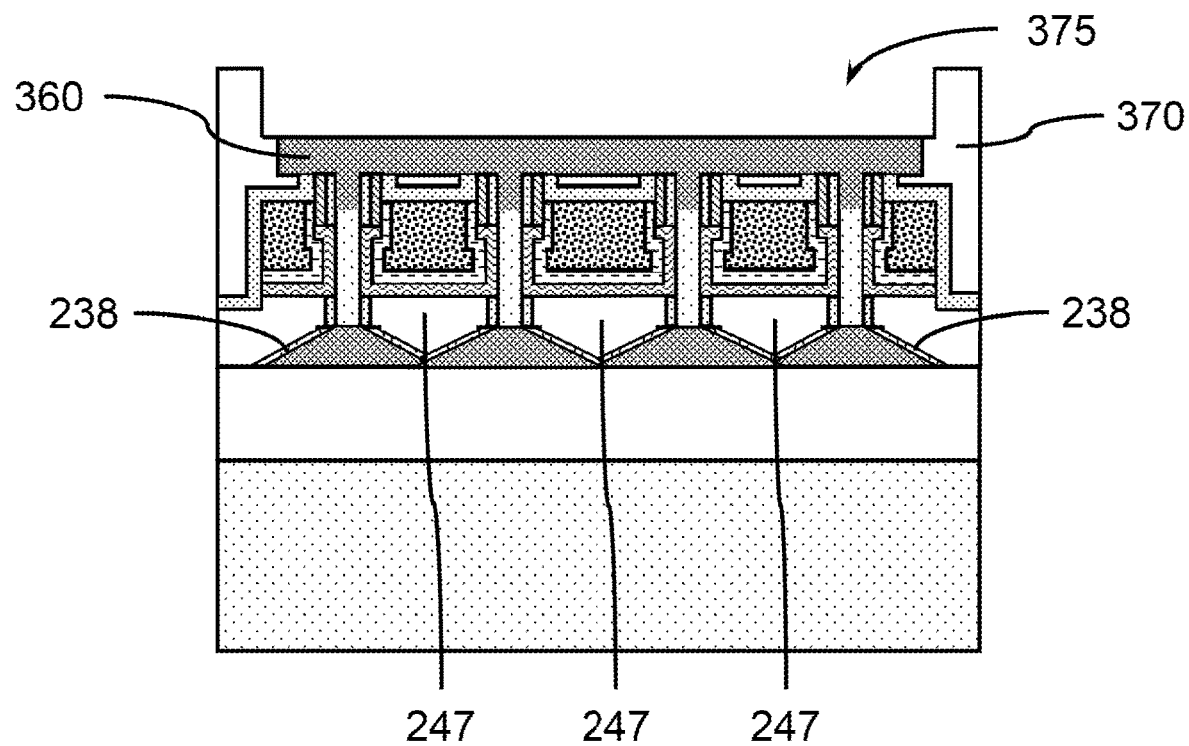
FIG. 38 is a cross-sectional side view of a silicide layer formed on the faceted sides of the source/drain layer, and an opening in the ILD layer, in accordance with an embodiment of the present invention.

FIG. 38 is a cross-sectional side view of a silicide layer formed on the faceted sides of the source/drain layer, and an opening in the ILD layer, in accordance with an embodiment of the present invention.

In one or more embodiments, a gaseous reactant can be introduced into the enlarged bottom void space(s) 247 to deposit a metal by ALD on the exposed faceted faces of the source/drain layer 230. In various embodiments, the deposited metal can be a metal that can form a silicide layer on the source/drain layer 230. In various embodiments, a heat treatment can be utilized to react the deposited metal with silicon of the source/drain layer 230 to form the silicide layer 238. Excess metal can be removed from the surface of the silicide layer 238 by a selective etch.

In one or more embodiments, an opening 375 can be formed in the ILD layer 370 above the top source/drain 360 for forming a subsequent electrical contact to the top source/drain 360. In various embodiments, a portion of the top source/drain 360 can be removed by etching to reduce the thickness of the top source/drain 360.

Figure 39:
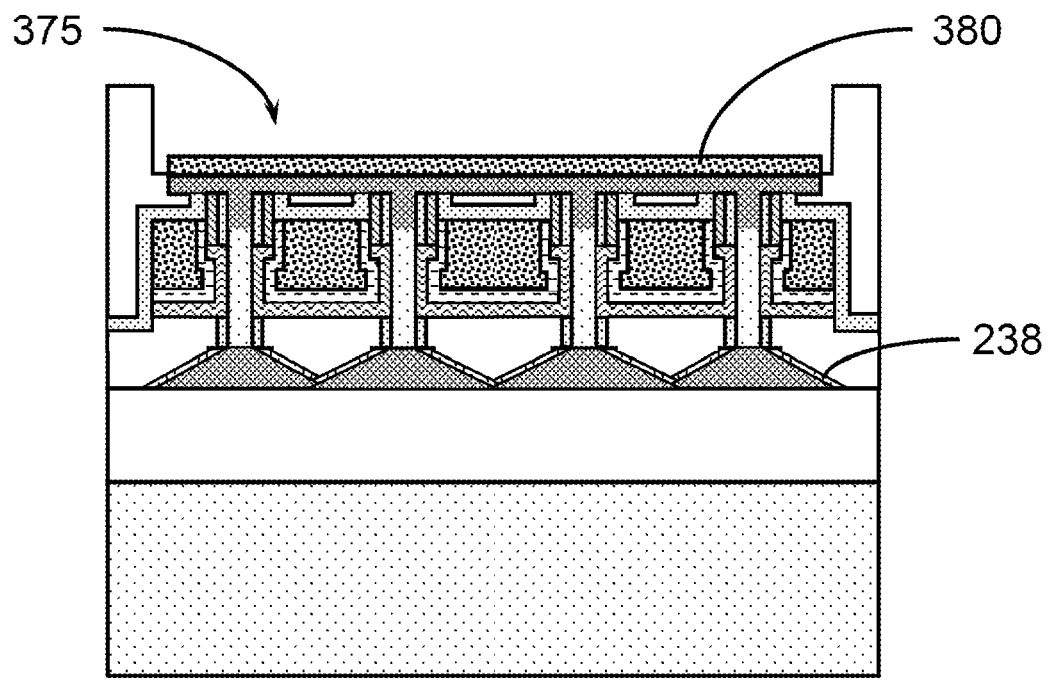
FIG. 39 is a cross-sectional side view of a silicide layer formed on the top source/drain layer, in accordance with an embodiment of the present invention.

FIG. 39 is a cross-sectional side view of a silicide layer formed on the top source/drain layer, in accordance with an embodiment of the present invention.

In one or more embodiments, a metal silicide layer 380 can be formed on the top source/drain 360. A metal, including but not limited to Ni, Pt, NiPt, Co, etc., can be used to form the metal silicide layer 380, where the metal can be blanket deposited on the exposed surfaces and annealed at a suitable temperature to form the metal silicide layer. The metal can be deposited, for example, by ALD, CVD, or a combination thereof. The unreacted metal can be removed by a selective etching.

Figure 40:
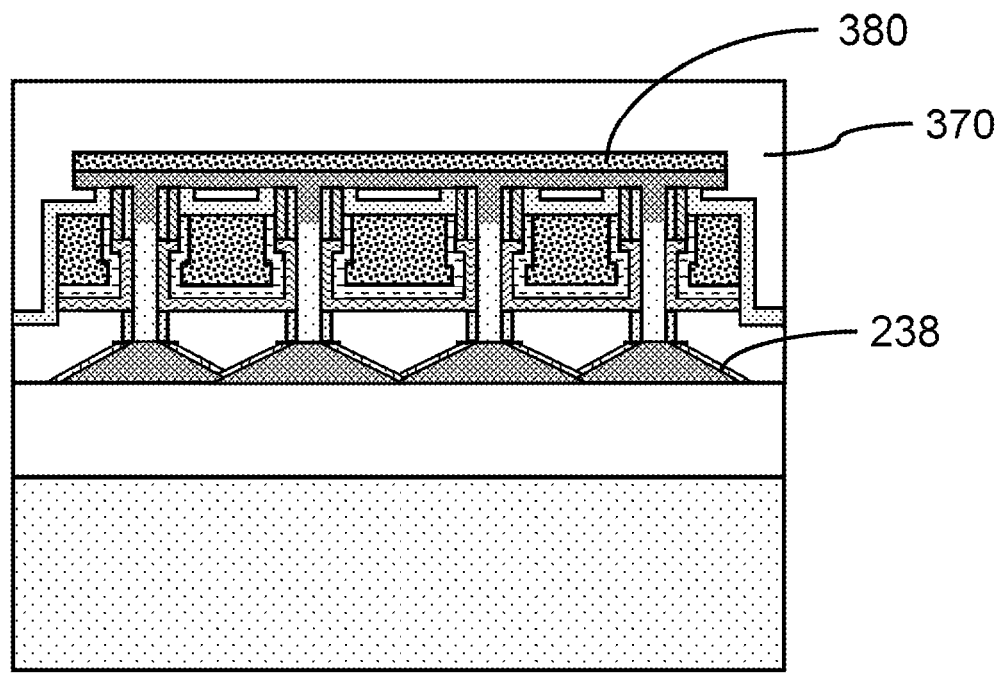
FIG. 40 is a cross-sectional side view of an ILD refill formed in the opening above the top source/drain, in accordance with an embodiment of the present invention.

FIG. 40 is a cross-sectional side view of an ILD refill formed in the opening above the top source/drain, in accordance with an embodiment of the present invention.

In one or more embodiments, the opening 375 above the top source/drain 360 can be filled with an ILD material to cover the metal silicide layer 380.

Figure 41:
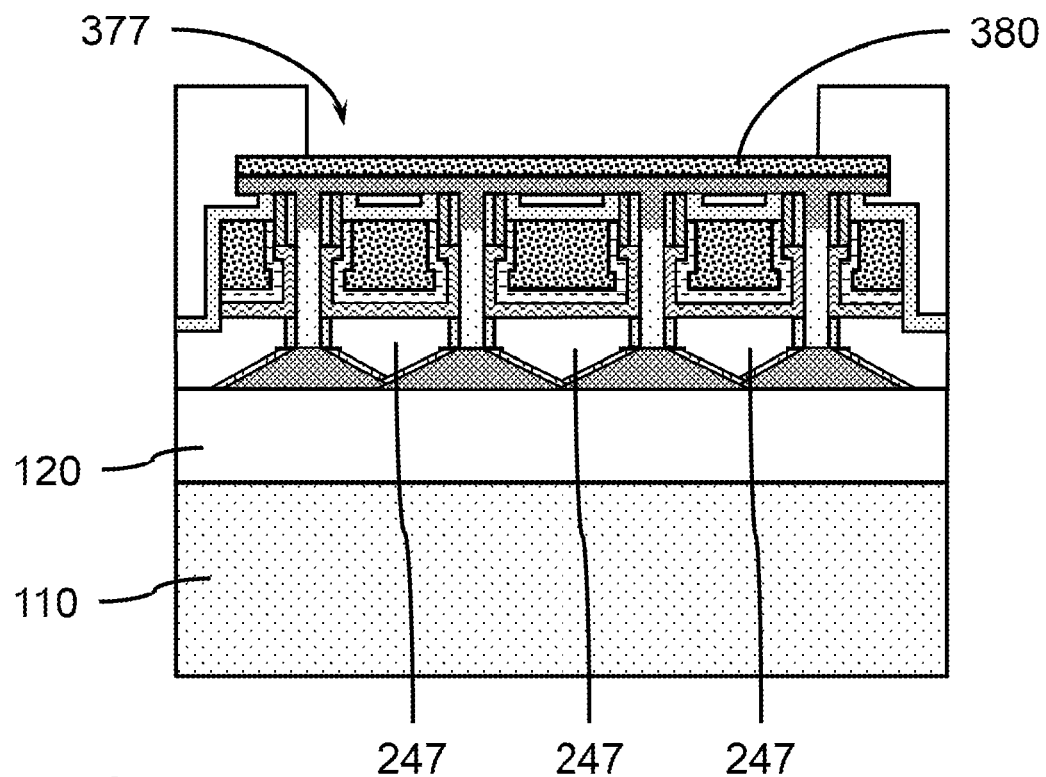
FIG. 41 is a cross-sectional side view of a second opening formed in the ILD layer above the top source/drain layer, in accordance with an embodiment of the present invention.

FIG. 41 is a cross-sectional side view of a second opening formed in the ILD layer above the top source/drain layer, in accordance with an embodiment of the present invention.

In one or more embodiments, a second opening 377 can be formed in the ILD refill down to the metal silicide layer 380 and top source/drain 360 to form an electrical contact.

Figure 42:
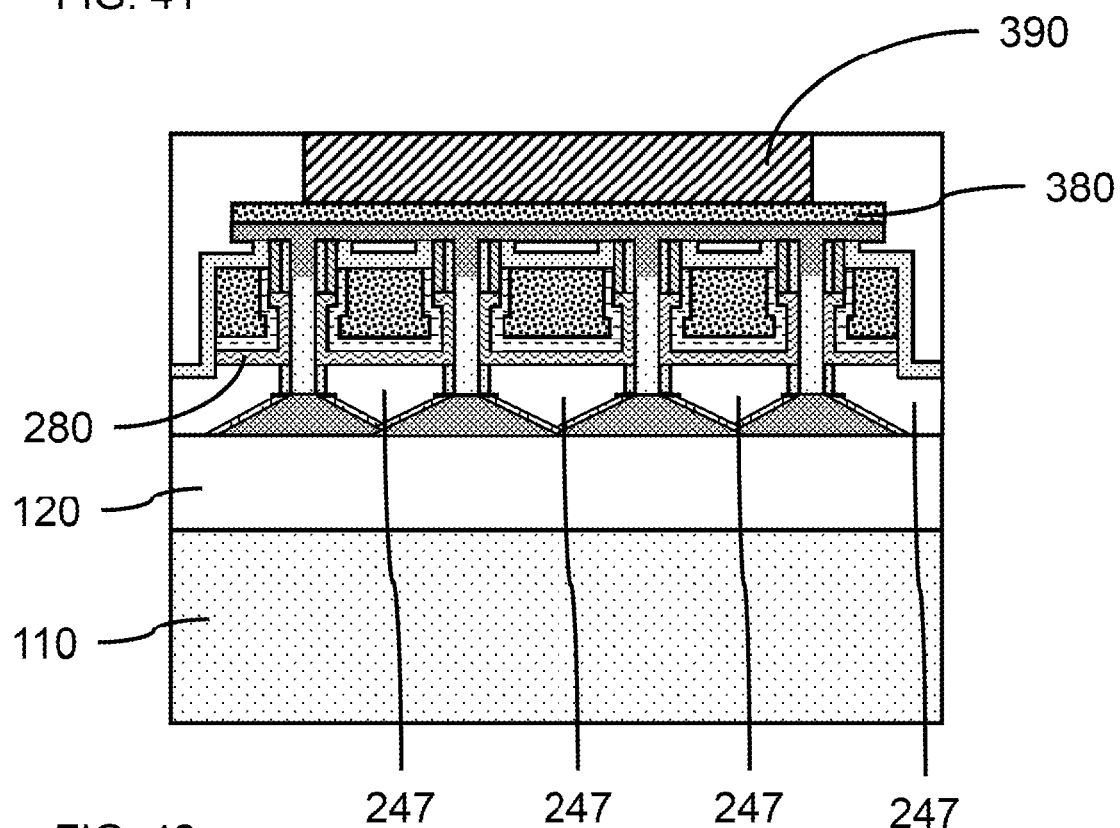
FIG. 42 is a cross-sectional side view of a conductive electrical contact formed in the second opening formed in the ILD layer to the silicide layer, in accordance with an embodiment of the present invention.

FIG. 42 is a cross-sectional side view of a conductive electrical contact formed in the second opening formed in the ILD layer to the silicide layer, in accordance with an embodiment of the present invention.

In one or more embodiments, a conductive metal fill 390 can be formed in the opening 377 to form a conductive electrical contact to the metal silicide layer 380 and top source/drain 360. The conductive metal fill 390 can be tungsten (W).

Figure 43:
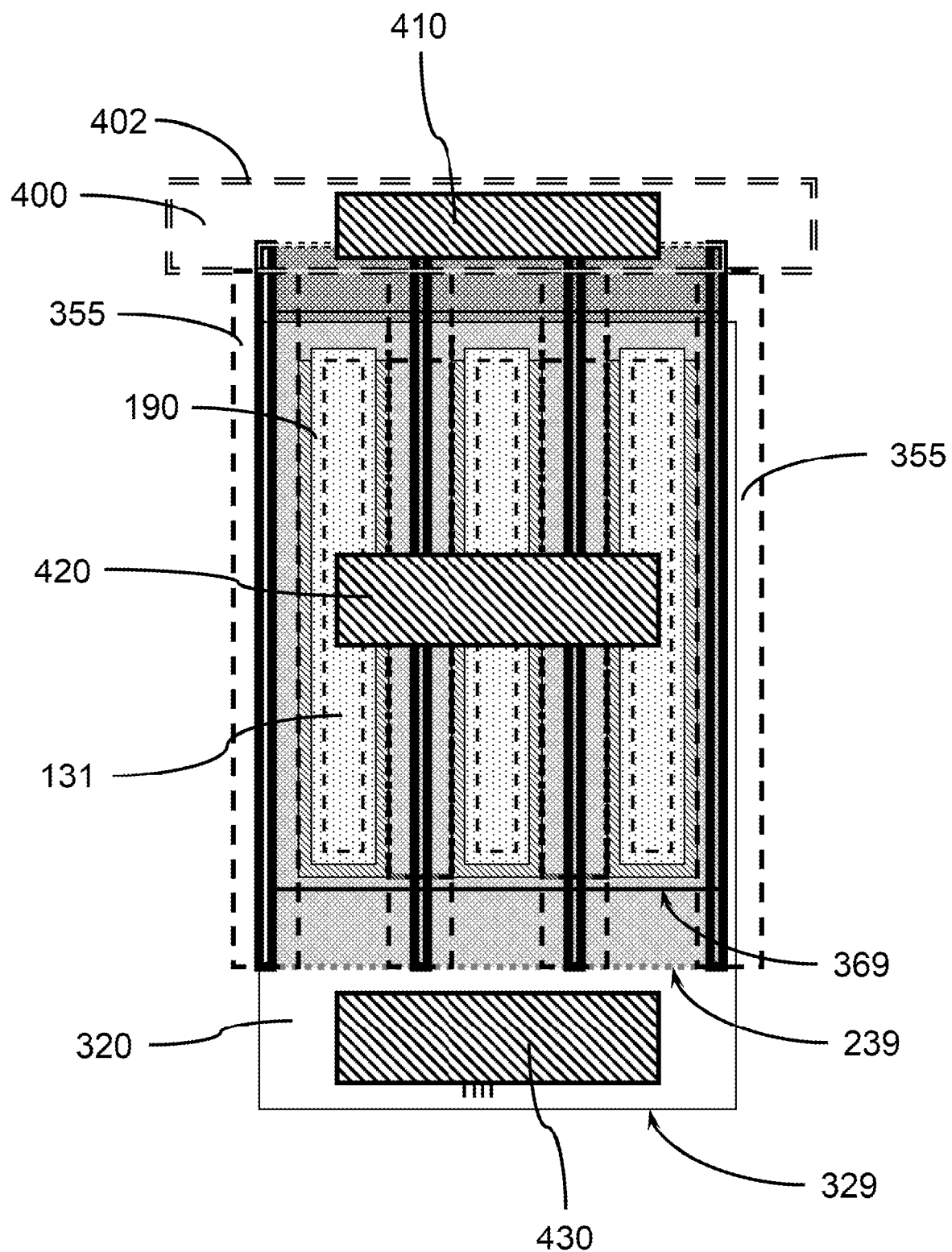
FIG. 43 is a top view of a multi-fin device showing the electrical contacts to the various device components, in accordance with an embodiment of the present invention.

FIG. 43 is a top view of a multi-fin device showing the electrical contacts to the various device components, in accordance with an embodiment of the present invention.

In one or more embodiments, a bottom source/drain contact 410 can be formed in an opening (e.g., via) in the ILD layer down to a portion of the source/drain layer 230. A top source/drain contact 420 can be formed in an opening in the ILD layer down to a portion of the top source/drain 360. A gate contact 430 can be formed in an opening in the ILD layer down to a portion of the gate metal fill 320. The top source/drain 360 can have a top source/drain perimeter 369 the defines the lateral boundary of the top source/drain 360. The source/drain layer 230 can have a source/drain layer perimeter 239 that defines the lateral boundary of the source/drain layer 230, where the source/drain layer perimeter 239 can be larger than the top source/drain perimeter 369. The gate metal fill 320 can have a gate metal fill perimeter 329 that extends beyond the top source/drain perimeter 369 in at least one direction.

In one or more embodiments, a channel liner 402 can be formed in the opening 400, before the opening 400 is refilled with ILD material to seal the opening formed for etching the sacrificial top spacer fill 350. In various embodiments, the upper void space(s) 355 can extend beyond the gate metal fill perimeter 329 and/or top source/drain perimeter 369 on the sides of the finFET device.

In a non-limiting exemplary embodiments, a method of forming a multi-fin field effect transistor device with air gaps can include forming a plurality of fins on a substrate; forming a source/drain layer on the substrate between the plurality of fins on a substrate; forming a sacrificial bottom spacer on the source/drain layer; forming a sacrificial spacer cap on the sacrificial bottom spacer; forming a gate dielectric layer on at least a portion of the plurality of vertical fins and on the sacrificial spacer cap; and removing the sacrificial bottom spacer to form a bottom void space between the source/drain layer and the gate dielectric layer.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated.

Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A fin field effect transistor device with air gaps, comprising:
    a source/drain layer on a substrate;
    a vertical fin in contact with the source/drain layer;
    a gate structure that covers a portion of the vertical fin;
    a top source/drain on the vertical fin;
    an inner liner on the gate structure;
    an upper spacer liner between the inner liner and the vertical fin; and
    an upper void space between the top source/drain and the inner liner.

2. The fin field effect transistor device of claim 1, further comprising an inner protective flange on the vertical fin, wherein the inner protective flange is in contact with the source/drain layer and a gate dielectric layer of the gate structure.

3. The fin field effect transistor device of claim 2, further comprising a work function layer on the gate dielectric layer.

4. The fin field effect transistor device of claim 3, further comprising an inner protective cap on the vertical fin, wherein the gate dielectric layer on the vertical fin is in contact with the inner protective cap and upper spacer liner on the vertical fin.

5. The fin field effect transistor device of claim 4, further comprising a gate metal fill on the work function layer.

6. The fin field effect transistor device of claim 5, wherein a portion of the inner liner forms a U-shaped trough, wherein the U-shaped trough is on three sides of the upper void space.

7. The fin field effect transistor device of claim 6, wherein the source/drain layer has facetted sides.

8. The fin field effect transistor device of claim 7, further comprising a bottom void space between the source/drain layer and the gate structure.

9. A fin field effect transistor device with air gaps, comprising:
    a source/drain layer on a substrate;
    a vertical fin in contact with the source/drain layer;
    a gate structure that covers a portion of the vertical fin;
    a top source/drain on the vertical fin;
    an upper void space between the top source/drain and the gate structure, and a bottom void space between the source/drain layer and the gate structure.

10. The fin field effect transistor device of claim 9, further comprising an inner protective cap on the vertical fin.

11. The fin field effect transistor device of claim 10, further comprising an upper spacer liner on the inner protective cap.

12. The fin field effect transistor device of claim 11, wherein the gate structure includes a gate dielectric layer that covers a portion of the vertical fin, and a gate metal fill on the gate dielectric layer, wherein the gate dielectric layer is in contact with the inner protective cap and upper spacer liner on the vertical fin.

13. The fin field effect transistor device of claim 12, further comprising an inner liner on the upper spacer liner and gate metal fill.

14. The fin field effect transistor device of claim 13, wherein the inner liner is a U-shaped trough.

15. The fin field effect transistor device of claim 14, wherein the source/drain layer has facetted sides.

16. A fin field effect transistor device with air gaps, comprising:
- a source/drain layer on a substrate;
- a vertical fin in contact with the source/drain layer;
- a gate structure that covers a portion of the vertical fin;
- a top source/drain on the vertical fin;
- an upper void space between the top source/drain and the gate structure;
- an inner protective cap on the vertical fin; and
- an upper spacer liner on the inner protective cap.

17. The fin field effect transistor device of claim 16, further comprising a bottom void space between the source/drain layer and the gate structure.

18. The fin field effect transistor device of claim 17, wherein the gate structure includes a gate dielectric layer that covers a portion of the vertical fin, where the gate dielectric layer forms a boundary on one side of the bottom void space.

19. The fin field effect transistor device of claim 18, wherein the source/drain layer has facetted sides, and a silicide layer is on the facetted sides.

20. The fin field effect transistor device of claim 19, wherein the bottom void space is an enlarged bottom void space.

* * * * *